US008024636B2

(12) United States Patent
Laprade et al.

(10) Patent No.: US 8,024,636 B2
(45) Date of Patent: Sep. 20, 2011

(54) SERIALLY CONCATENATED CONVOLUTIONAL CODE DECODER WITH A CONSTRAINED PERMUTATION TABLE

(75) Inventors: Maria Laprade, Palm Bay, FL (US); Matthew C. Cobb, W. Melbourne, FL (US); Timothy F. Dyson, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 1173 days.

(21) Appl. No.: 11/744,440

(22) Filed: May 4, 2007

(65) Prior Publication Data
US 2010/0031122 A1 Feb. 4, 2010

(51) Int. Cl.
H03M 13/00 (2006.01)
H03M 13/03 (2006.01)
(52) U.S. Cl. .................................. 714/755; 714/786
(58) Field of Classification Search .................. 714/763, 714/786, 752, 755
See application file for complete search history.

(56) References Cited

U.S. PATENT DOCUMENTS

| | | | |
|---|---|---|---|
| 6,029,264 A * | 2/2000 | Kobayashi et al. ........... 714/755 |
| 6,202,189 B1 | 3/2001 | Hinedi et al. | |
| 6,263,466 B1 | 7/2001 | Hinedi et al. | |
| 6,323,788 B1 | 11/2001 | Kim et al. | |
| 6,690,739 B1 * | 2/2004 | Mui ............... 375/265 |
| 6,775,800 B2 | 8/2004 | Edmonston et al. | |
| 6,789,218 B1 | 9/2004 | Edmonston et al. | |
| 6,983,412 B2 | 1/2006 | Fukumasa | |
| 7,093,179 B2 | 8/2006 | Shea | |
| 7,200,798 B2 | 4/2007 | Bickerstaff | |
| 7,246,296 B2 * | 7/2007 | Yokokawa et al. ........... 714/755 |
| 7,302,621 B2 | 11/2007 | Edmonston et al. | |
| 7,673,213 B2 | 3/2010 | Chugg et al. | |
| 7,730,378 B2 * | 6/2010 | Li et al. .................... 714/755 |
| 7,770,087 B2 | 8/2010 | Laprade et al. | |
| 7,770,093 B2 * | 8/2010 | Divsalar et al. ............... 714/794 |
| 2004/0225940 A1 | 11/2004 | Kerr et al. | |
| 2005/0229087 A1 | 10/2005 | Kim et al. | |
| 2007/0079223 A1 * | 4/2007 | Mondin et al. ................. 714/780 |

OTHER PUBLICATIONS

Benedetto, et al., "A Soft-Input Soft-Output APP Module for Iterative Decoding of Concatenated Codes," IEEE Comm. Letters, vol. 1, No. 1, Jan. 1997 pp. 22-24.
Benedetto, et al., "Serial Concatenation of Interleaved Codes: Performance Analysis, Design, and Iterative Decoding," IEEE Transactions on Information Theory, vol. 44, No. 3, May 1988, pp. 909-926.

(Continued)

*Primary Examiner* — James C Kerveros
(74) *Attorney, Agent, or Firm* — Fox Rothschild, LLP; Robert J. Sacco

(57) ABSTRACT

A Serially Concatenated Convolutional Code (SCCC) decoding system includes an outer decoder module (208), permutation module (104), and data store (114). The outer decoder module is configured to generate a first sequence of soft-decision bits $x[n]$ for $n=0, 1, 2, \ldots, N-1$. The permutation module is configured to permute the first sequence of soft-decision bits $x[n]$ to generate a second sequence of soft-decision bits $y[n]$. The first sequence of soft-decision bits $x[n]$ is generated by the outer decoder module in accordance with a mapping $v[n]$. The second sequence of soft-decision bits $y[n]$ is generated for communication to an inner decoder module (204). The data store contains a mapping $v[n]$. The mapping $v[n]$ satisfies a mathematical equation $v[k+m \cdot (N/M)]$ modulo $(N/M) = v[k]$ modulo $(N/M)$ for $m=0, \ldots, M-1$ and $k=0, \ldots, (N/M-1)$. (NM) is an integer.

15 Claims, 14 Drawing Sheets

OTHER PUBLICATIONS

Garello, et al., "Computing the Free Distance of Turbo Codes and Serially Concatenated Codes with Interleavers: Algorithms and Applications," IEEE Jnl on Selected Areas in Communications, vol. 19, No. 5, May 2001, pp. 800-812.

Bosco, et al., "A New Algorithm for 'Hard' Iterative Decoding of Concatenated Codes," IEEE Transactions on Communications, vol. 51, No. 8, Aug. 2003, pp. 1229-1232.

Benedetto, et al., "Serial Concatenation of Block and Convolutional Codes," Electronics Letters, May 9, 1996, vol. 32, No. 10, pp. 887-888.

Benedetto, et al., "Iterative decoding of serially concatenated convolutional codes," Electronics Letters, Jun. 20, 1996, vol. 32, No. 13, pp. 1186-1188.

Benedetto, et al., "Concatenated codes with interleaver for digital transmission over mobile channels," IEEE International Conference on Communications, 2001. ICC 2001, ICC 2001. Jun. 11-14, 2001, pp. 3026-3030, vol. 10.

Scanavino, et al., "Convergence properties of iterative decoders working at bit and symbol level," Global Telecommunications Conference, 2001, IEEE vol. 2, Nov. 25-29, 2001, pp. 1037-1041.

Benedetto, et al., "On the Design of Binary Serially Concatenated Convolutional Codes," Communication Theory Mini-Conference, 1999, Jun. 6-10, 1999, pp. 32-36.

Benedetto et al., "Serial Concatenated Trellis Coded Modulation with Iterative Decoding," Proceedings, 1997, IEEE International Symposium on Information Theory. Jun. 29-Jul. 4, 1997, p. 8.

Benedetto, et al., "Serial concatenation of interleaved codes: performance analysis, design and iterative decoding," IEEE International Symposium on Information Theory, 1997 Proceedings. p. 106.

Benedetto, et al., "Serial concatenation of interleaved codes: analytical performance bounds," Global Telecommunications Conf., 1996. "Communications: The Key to Global Prosperity," vol. 1, Nov. 18-22, 1996, pp. 106-110.

Chandran, "MAP Algorithm FAQ," found on the WWW at <<http://www.ittc.ku.edu/~rvc/projects/faq/map.htm>> printed on Feb. 5, 2007.

U.S. Appl. No. 11/685,849, Laprade et al.
U.S. Appl. No. 11/685,919, Laprade et al.
U.S. Appl. No. 11/931,156, Laprade et al.

* cited by examiner

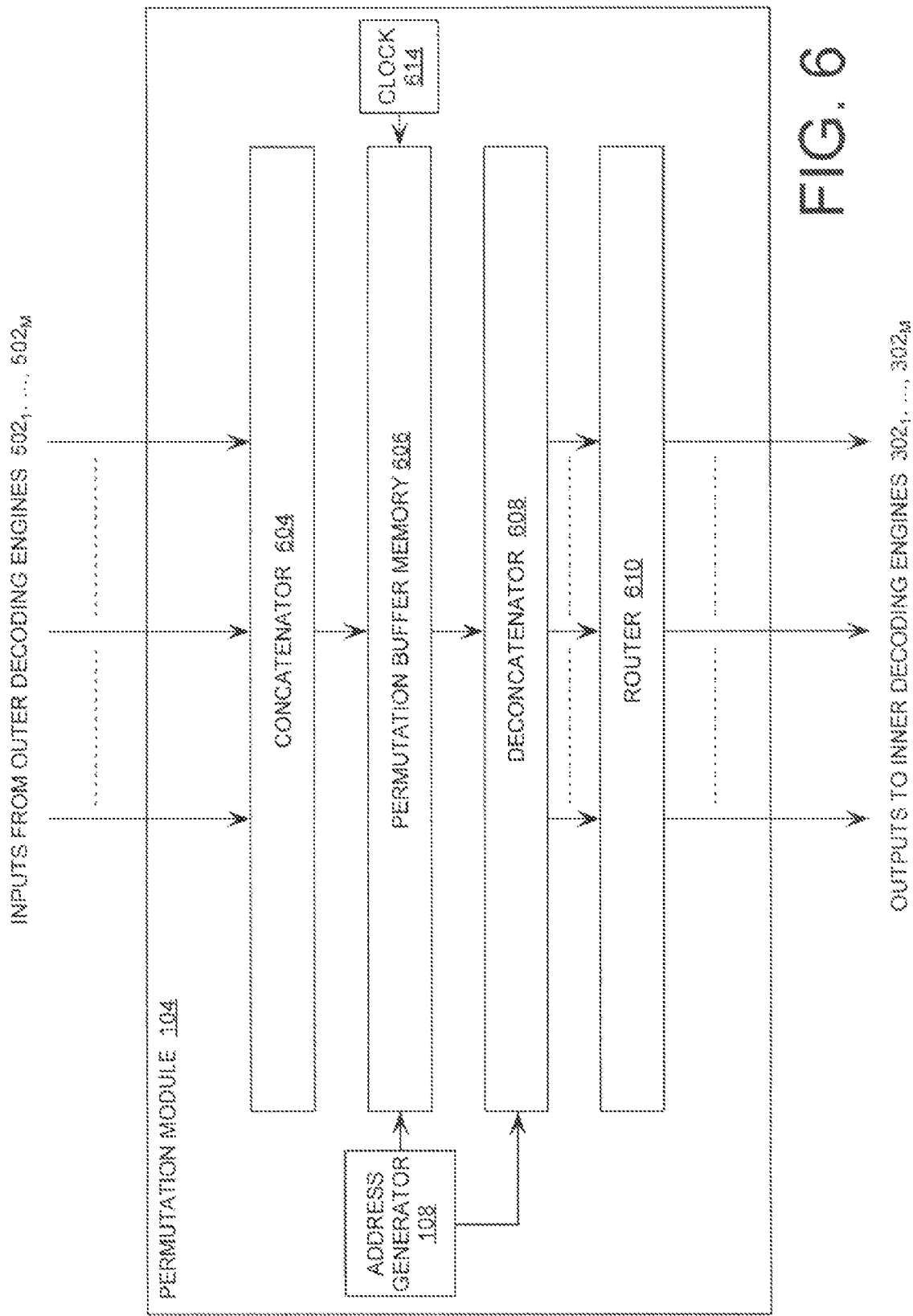

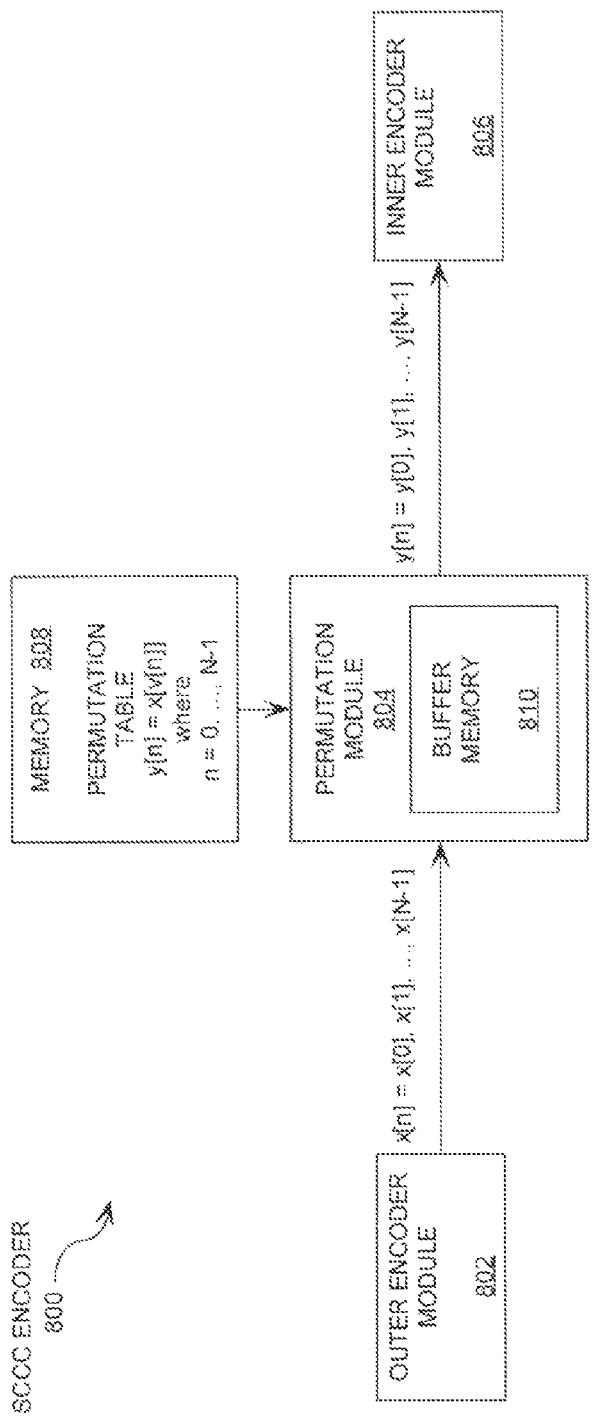
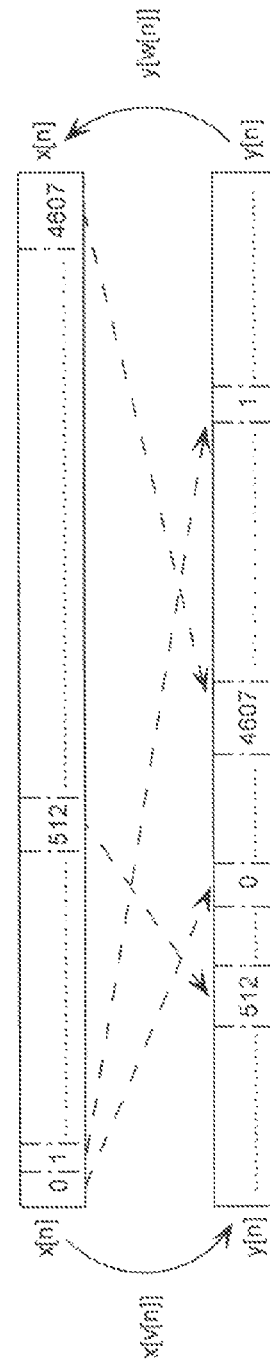

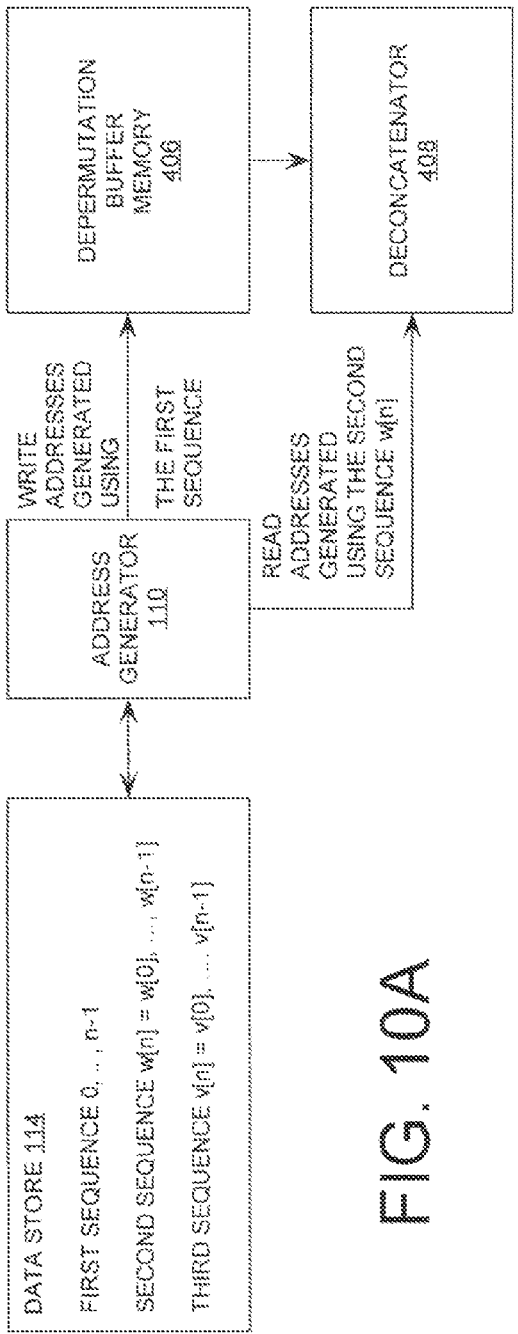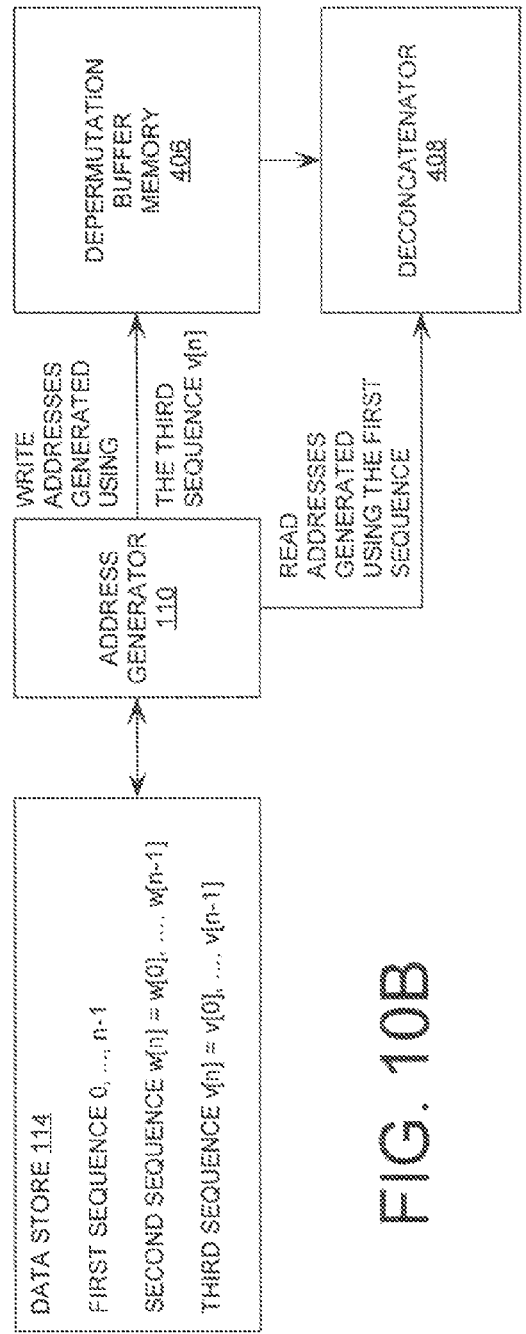

SERIALLY CONCATENATED CONVOLUTIONAL CODE DECODER WITH A CONSTRAINED PERMUTATION TABLE

STATEMENT REGARDING FEDERALLY SPONSORED RESEARCH OR DEVELOPMENT

This invention was made with Government support under Contract No. FA8808-04-C-0022 awarded by the U.S. Air Force. The Government has certain rights in this invention.

BACKGROUND OF THE INVENTION

1. Statement of the Technical Field

The inventive arrangements relate to digital communication equipment using an error correction technique. More particularly, the inventive arrangements relate to a serially concatenated convolutional code decoder.

2. Description of the Related Art

A serially concatenated convolutional code (SCCC) decoder provides a means for recovering information bits from a codeword. A codeword is often comprised of a bitstream that has been encoded using a forward error correction (FEC) technique based on at least one convolutional code. A codeword may be a relatively large sequence of information bits (for example, a few thousand information bits) to provide a high recoverability of encoded information contained therein.

One algorithm that is conventionally used in SCCC decoders for decoding coded sequences is the MAP algorithm. MAP is an acronym for the phrase "Maximum Aposteriori Probability." The MAP algorithm provides a method for determining the most probable information bits which were transmitted based on a noisy signal received over a communication channel. It is known in the art that the MAP algorithm is an inherently Soft-Input, Soft-Output (SISO) algorithm. Soft information refers to soft-values (which are represented by soft-decision bits) that comprise information about the bits contained in a coded sequence. In particular, soft-values are values that represent the probability that a particular bit in a coded sequence is either a one (1) or a zero (0). For example, a soft-decision value for a particular bit can indicate that a probability of a bit being a one (1) is p(1)=0.3. Conversely, the same bit can have a probability of being a zero (0) which is p(0)=0.7. The most commonly used soft values are log-likelihood ratios (LLR's). An LLR which is a positive value suggests that the bit is most likely to be a one (1) whereas a negative LLR suggests that the value of the bit is most likely a zero (0).

It is known that soft values can be used in SCCC devices for decoding concatenated codes. In general, concatenated codes use two codes (an inner code and an outer code) with some interleaving between them. Accordingly, SCCC decoders are commonly implemented with two separate decoders that are each utilizing MAP algorithms for the decoding process. An inner decoder decodes the inner code and an outer decoder decodes the outer code. The decoders are commonly configured for operation in an iterative process where the outputs of one decoder is repeatedly communicated to the other decoder. Since the MAP algorithm is a SISO type algorithm, the soft-values (represented by soft decision bits) generated by the MAP algorithm in one decoder can be used as inputs to the MAP algorithm in the other decoder.

During a first iteration of a concatenated code, an inner decoder processes soft-decision value approximations to bits output from an inner encoder. As a result of this processing, the inner decoder outputs soft-decision value approximations to the bits that were input to the inner encoder in an encoding process. Similarly, the outer decoder uses soft-decision value approximations to bits output from an outer encoder. Since the bits output from the outer encoder were permuted or interleaved (as explained in the preceding paragraph), the soft-decision value approximations are derived by applying a reverse permutation to the soft-decision value approximations output from the inner decoder prior to being communicated to the outer decoder. This reverse permutation is known in the art as depermutation. The outer decoder can produce two different outputs. One is a soft-decision value approximation to data that was input to the outer encoder. This data is the original, unencoded data, and is not of interest until a final iteration. This data need not be permuted or depermuted. The other output of the outer decoder is a refinement to soft-decision value approximations to bits output from an outer encoder. This output is interleaved (i.e., re-arranged) in the same manner as an encoder permuted output bits of the outer encoder prior to communicating the bits to the inner encoder. These permuted soft-decision value approximation outputs from the outer decoder approximate the bits input to the inner encoder and can therefore be used in a second iteration of the decoding process.

During the second iteration of the decoding process, the permuted soft-decision value approximation outputs are communicated to the inner decoder. In this regard, it should be appreciated that the inner decoder uses the permuted soft-decision values approximations of bits input to the inner encoder to produce refined soft-decision value approximations of bits input to the inner encoder. The inner decoder also uses the soft-decision value approximations of bits output from the inner encoder to produce refined soft-decision value approximations of bits input to the inner encoder.

A plurality of SCCC decoders can be implemented in a parallel configuration on a field programmable gate array (FPGA) or an application specific integrated circuit (ASIC). Each of the SCCC decoders is coupled to a respective random access memory (RAM) data store via a system bus. Each RAM data store contains data needed by a respective SCCC decoder to sequentially write sets of serially linked soft-decision bits to a depermutation and/or a permutation buffer memory for storage. Each RAM data store also contains data needed by a respective SCCC decoder to non-sequentially read sets of serially linked soft-decision bits from the depermutation and/or permutation buffer memory.

Each SCCC decoder is comprised of an input buffer memory, a processing loop module, and an output buffer memory. The input buffer memory is comprised of hardware and firmware configured to receive encoded soft-decision bits from an external device and to temporarily store the same. The processing loop module is comprised of hardware and firmware configured to decode soft-decision bits using an iterative process (described in greater detail below). In this regard, it should be appreciated that the processing loop module is often comprised of an inner decoder module, a depermutation module, an outer decoder module, and a permutation module. The output buffer memory is comprised of hardware and firmware configured to receive decoded soft-decision bits from the processing loop module and to temporarily store the same.

With regard to the processing loop module, the burden of decoding information contained within a codeword is split between the inner decoder module and the outer decoder module. In this regard, it should be appreciated that the inner decoder module and the outer decoder module employ methods of maximum a posteriori (MAP) decoding or max-log approximations to MAP decoding. MAP decoding and max-log approximations to MAP decoding are well known to persons skilled in the art. Thus, such methods will not be described in great detail herein.

The inner decoder module is often comprised of hardware and firmware configured to obtain a sequence of soft-decision bits from the input buffer memory and/or the permutation module. Upon receipt of all or a portion of a soft-decision bit sequence, the inner decoder module begins processing the received soft-decision bits. This processing typically involves performing a relatively simple decoding operation based on a corresponding convolutional inner code. After processing the soft-decision bits, the inner decoder communicates the processed soft-decision bits to the depermutation module for depermutation (i.e., rearrangement or reorganization) and storage in a depermutation buffer memory. In this regard, if should be understood that the depermutation of processed soft-decision bits is accomplished by reading the stored soft-decision bits from the depermutation buffer memory in an order different from an order in which the soft-decision bits were written to the depermutation buffer memory for storage. It should also be understood that depermutation of soft-decision bits is necessary to reverse a permutation of information bits that occurred in an encoding process.

The outer decoder module is comprised of hardware and firmware configured to receive a sequence of depermuted soft-decision bits communicated from the depermutation module. Upon receipt of all or a portion of a soft-decision bit sequence, the outer decoder module begins processing the received soft-decision bits. This processing typically involves performing a relatively simple decoding operation based on a corresponding conventional outer code. After processing the soft-decision bits, the outer decoder module communicates the processed soft-decision bits to the permutation module for permutation (i.e., rearrangement or reorganization) and storage in a permutation buffer memory. It should be understood that permutation is necessary to realign the soft-decision bits to the permutation that occurred in an encoding process. The permutation of processed soft-decision bits is accomplished by reading the stored soft-decision bits from the permutation buffer memory in an order different from an order in which the soft-decision bits were written to the permutation buffer memory for storage. Thereafter, a sequence of permuted soft-decision bits is communicated, along with the original codeword, to the inner decoder module.

The above described process is performed for 'M' iterations. After 'M' iterations, the outer decoder module produces decoded information bits. Subsequently, the outer decoder module forwards the decoded information bits to the output buffer memory for storage.

Despite the advantages of such a conventional SCCC decoder, it suffers from certain drawbacks. For example, the above-described decoding system employing a number of parallel processing SCCC decoders and associated RAM data stores is hardware resource intensive. Furthermore, the above described decoding process requires a relatively large amount of time to complete. As such, there also remains a need for a SCCC decoder having an improved processing time with a negligible performance loss.

SUMMARY OF THE INVENTION

The invention concerns a method for permuting a sequence of information bits in a serially concatenated conventional code (SCCC) system. The method includes generating a first sequence of information bits $x[n]$ using an outer encoder, n is an integer selected from the group consisting of $0, 1, 2, \ldots, N-1$. The method also includes permuting the first sequence of information bits in accordance with a mapping $v[n]$ to generate a second sequence of information bits $y[n]$. The method further includes communicating the second sequence of information bits to an inner encoder for generating an encoded sequence of Information bits. The method includes selecting $v[n]$ so that $v[k+m\cdot(N/M)]$ modulo $(N/M)=v[k]$ modulo $(N/M)$ for $m=0, \ldots, M-1$ and $k=0, \ldots, (N/M-1)$. $(N/M)$ is an integer value.

According to an aspect of the invention, the method includes selecting M so that it is equal to a predetermined number of decoding engines operating in parallel. The decoding engines are provided to decode the encoded sequence of information bits. The method also includes decoding the encoded sequence of information bits in an inner decoding module using M inner decoding engines to generate M outputs. The method further includes concatenating the plurality of M outputs from the M inner decoding engines to form a concatenated codeword segment. The concatenated codeword segments are stored at a predetermined memory location in a depermutation buffer memory.

According to another aspect of the invention, the method includes retrieving one of the concatenated codeword segments from the depermutation buffer memory. The method also includes de-concatenating the concatenated word segment to isolate the M outputs. The method further includes respectively routing the M outputs to a plurality of M outer decoding engines. The method includes determining an address from which the concatenated codeword segment is retrieved based on a mapping $w[n]$ which is defined as an inverse of the mapping $v[n]$.

An SCCC decoding system is also provided. The SCCC decoding system is comprised of an outer decoder module, a permutation module, and at least one data store. The outer decoder module is configured to generate a first sequence of soft-decision bits $x[n]$ for $n=0, 1, 2, \ldots, N-1$. The permutation module is configured to permute the first sequence of soft-decision bits $x[n]$ to generate a second sequence of soft-decision bits $y[n]$. The first sequence of soft-decision bits $x[n]$ is generated by the outer decoder module in accordance with a mapping $v[n]$. The second sequence of soft-decision bits $y[n]$ is generated for communication to an inner decoder module. The data store has a mapping $v[n]$ stored therein. The mapping $v[n]$ satisfies a mathematical equation $v[k+m\cdot(N/M)]$ modulo $(N/M)=v[k]$ modulo $(N/M)$ for $m=0, \ldots, M-1$ and $k=0, \ldots, (N/M-1)$. $(N/M)$ is an integer value.

According to an aspect of the invention, M is equal to a predetermined number of decoding engines operating in parallel in the inner and outer decoder modules. The M decoding engines in the outer decoder module generate M outputs. The permutation module is further comprised of a concatenator. The concatenator is configured to concatenate the M outputs from the M outer decoding engines to form a concatenated codeword segment. The permutation buffer memory is coupled to the concatenator. The permutation buffer memory is configured to store a plurality of concatenated word segments. Each concatenated word segment is stored in a predetermined memory location.

According to another aspect of the invention, the SCCC decoding system is comprised of a deconcatenator operatively coupled to the permutation buffer memory. The deconcatenator is configured to individually retrieve the concatenated codeword segments from the permutation buffer memory. The deconcatenator is also configured to deconcatenate each concatenated codeword segment to isolate the M outputs contained therein. The SCCC decoding system is also comprised of a router operatively coupled to the deconcatenator. The router is configured to respectively route the M outputs to a plurality of M inner decoding engines. The SCCC decoding system is further comprised of an address generator. The address generator is configured to determine an address from which the concatenated codeword segment is retrieved based on a mapping w[n]. The mapping w[n] is defined as an inverse of the mapping v[n].

BRIEF DESCRIPTION OF THE DRAWINGS

Embodiments will be described with reference to the following drawing figures, in which like numerals represent like items throughout the figures, and in which:

FIG. 6 is a detailed block diagram of a permutation module that is useful for understanding the invention.

FIG. 8 is a block diagram of an SCCC encoder that is useful for understanding the invention.

FIG. 9 is an illustration of two code blocks which are related based on a defined permutation sequence.

FIG. 10A is a block diagram that is useful for understanding how a first depermutation table is used in the inventive arrangements.

FIG. 10B is a block diagram that is useful for understanding how a second depermutation table is used in the inventive arrangements.

DETAILED DESCRIPTION OF THE PREFERRED EMBODIMENTS

The invention will now be described more fully hereinafter with reference to accompanying drawings, in which illustrative embodiments of the invention are shown. This invention, may however, be embodied in many different forms and should not be construed as limited to the embodiments set forth herein. Some embodiments of the present invention provide a decoding system having an improved parallel processing time with negligible performance loss. Some embodiments of the present invention also provide a constrained permutation table. The phrase "permutation table" as used herein refers to a set of normal permutation and inverse permutation data stored in a system memory according to a table format (i.e., rows and columns). Normal permutation data is data including information necessary for reading data from permutation buffer memory (described below in relation to FIG. 6) locations in a given non-sequential order. Inverse permutation data is data including information necessary for reading data from depermutation buffer memory (described below in relation to FIG. 4) locations in a given non-sequential order. The constrained permutation table ensures that a set of soft-decision bits which are to be processed at the same time by a plurality of outer/inner decoding engines are written to a memory location having a single address. The constrained permutation table also ensures that a single read from each of the permutation and depermutation buffer memories is required per decoding cycle. Prior to discussing these novel features, it is useful to understand the operation of a serially concatenated convolutional code (SCCC) decoding system in greater detail.

SCCC Decoding System

Figure 1:
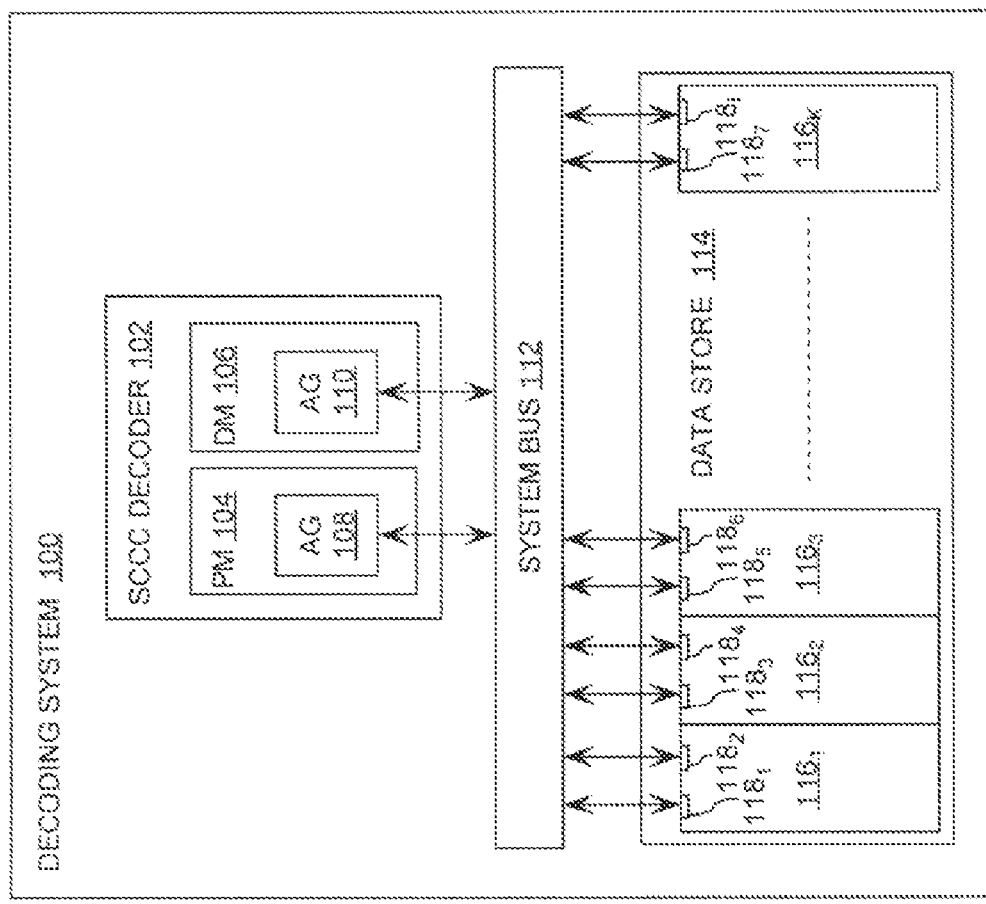
FIG. 1 is a block diagram of a serially concatenated conventional code (SCCC) decoding system that is useful for understanding the invention.

Referring now to FIG. 1, there is provided a block diagram of a SCCC decoding system 100 that is useful for understanding the invention. The decoding system 100 is implemented on a programmable device, such as a field programmable gate array (FPGA) or an application specific integrated circuit (ASIC). According to an embodiment of the invention, the decoding system 100 is advantageously selected as an FPGA having a model number XC2V8000 which is available from Xilinx, Inc., of San Jose, Calif. Still the invention is not limited in this regard. Any programmable device having a substantially fast parallel processing time feature can be used without limitation.

As shown in FIG. 1, the decoding system 100 is comprised of a serially concatenated convolutional code (SCCC) decoder 102 configured to concurrently process information bits encoded using a forward error correction (FEC) encoding technique based on a series of convolution codes, separated by a permutation step. As illustrated in FIG. 1, the SCCC decoder 102 is comprised of a permutation module 104 and a depermutation module 106. Each of these modules 104, 108 is comprised of an address generator 108, 110, respectively.

The decoding system 100 is also advantageously comprised of a data store 114 connected to the SCCC decoder 102. The data store 114 is provided for storing several specific types of data that are utilized by the address generators 108, 110 contained in each of the modules 104, 108. The address generators 108, 110 are configured to access the data store 114 through a system bus 112. The address generators 108, 110 are also configured to retrieve data from the data store 114 for generating sequentially or non-sequentially ordered memory space addresses.

The data store 114 is configured to allow stored data to be accessed by the address generators 108, 110 in any order. According to an embodiment of the invention, the data store 114 is a random access memory (RAM). Still, the invention is not limited in this regard. Conventional FPGA devices provide electronically available memory in the form of a plurality of memory blocks. For example, the XC2V8000 from Xilinx offers numerous eighteen kilobit (18 kbit) blocks of memory. As shown in FIG. 1, the data store 114 is comprised of two or more such memory blocks $116_1$-$116_K$. Each memory block $116_1$-$116_K$ has a predetermined bit memory space. For example, each of the memory blocks $116_1$-$116_K$ has an eighteen kilobit (18 kbit) memory space. Still the invention is not limited in this regard.

In a conventional FPGA, one or more access ports are generally provided for accessing data contained in each memory block $116_1$-$116_K$. For example, the XC2V8000 from Xilinx offers two data ports for each eighteen kilobit (18 kbit) block of memory. Referring again to FIG. 1, each memory block $116_1$-$116_K$ is comprised of at least two access ports $118_1$-$118_I$ for accessing data stored therein.

The data stored in the memory blocks $116_1$-$116_K$ is comprised of address and compression data. The address and compression data are comprised of information necessary for writing groups of serially linked soft-decision bits to permutation buffer memory (described below in relation to FIG. 8) locations in a sequential or non-sequential order. The data stored in the memory blocks $116_1$-$116_K$ is also comprised of permutation data. The permutation data is comprised of information necessary for reading soft-decision bits from the permutation buffer memory in a predetermined order defined by a permutation sequence used in an encoding process. As such, the permutation module 104 is operatively coupled to each of the access ports $118_1$-$118_I$ via the system bus 112.

Similarly, the data stored in the memory blocks $116_1$-$116_K$ is comprised of address data and compression data needed by the depermutation module 106 for sequentially or non-sequentially writing groups of serially linked soft-decision bits to a depermutation buffer memory (described below in relation to FIG. 4) for storage. The data stored in the memory blocks $116_1$-$116_K$ is also comprised of inverse permutation data. The inverse permutation data is comprised of information necessary for reading groups of serially linked soft-decision bits from the depermutation buffer memory in an order selected to reverse the effects of the reordering performed during the permutation step. As such, the depermutation module 106 is operatively coupled to each of the access ports $118_1$-$118_I$ via the system bus 112.

Figure 2:
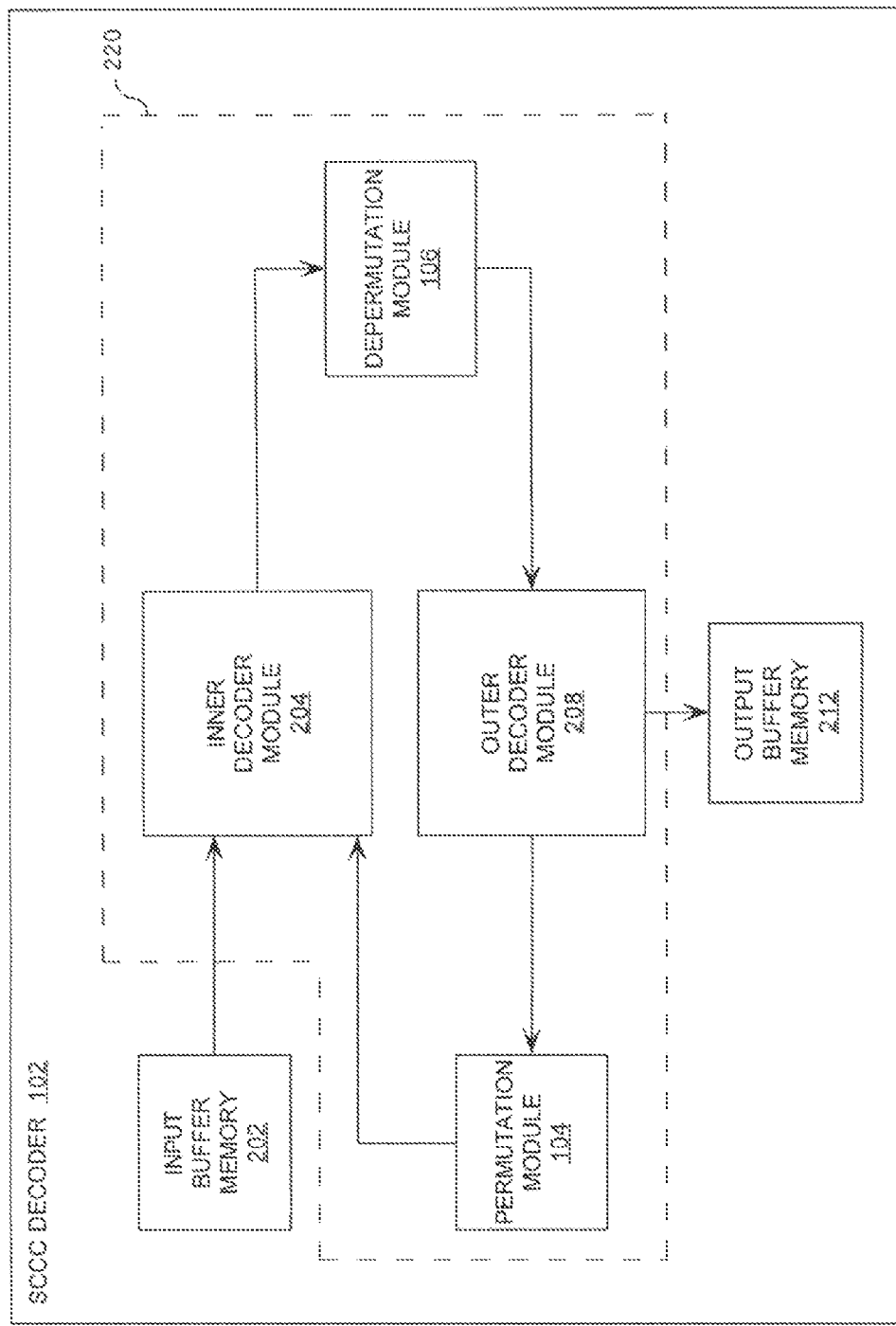
FIG. 2 is a block diagram of an SCCC decoder that is useful for understanding the invention.

Referring now to FIG. 2, an SCCC decoder 102 is shown that is useful for understanding the invention. If should be understood that the SCCC decoder 102 is comprised of an input buffer memory 202, a processing loop module 220, and an output buffer memory 212. Although only a single input buffer memory 202, processing loop module 220, and output buffer memory 212 is shown in FIG. 2, it should be understood that the SCCC decoder 102 can be comprised of any number of these components 202, 220, 212. For example, the SCCC decoder 102 can be comprised of two (2) or more parallel processing loop modules 220.

Referring again to FIG. 2, the input buffer memory 202 provides a data store for soft-decision bits communicated from an external device (not shown) and received at the SCCC decoder 102. In this regard, it should be appreciated that the input buffer memory 202 provides a means for storing soft-decision bits in a codeblock format. Codeblock formats are well known to persons skilled in the art. Thus, codeblock formats will not be described in great detail herein. Also, methods for storing soft-decision bits in a codeblock format are well known by persons skilled in the art. Any such method can be used without limitation.

According to an embodiment of the invention, a codeblock is selected to include thousands of soft-decision bits, e.g., four thousand six hundred eight (4,608) soft-decision bits. Still, the invention is not limited in this regard. A codeblock can be selected to include any number of soft-decision bits in accordance with a particular SCCC decoder 102 application.

As shown in FIG. 2, the input buffer memory 202 is coupled to the processing loop module 220. The processing loop module 220 is comprised of hardware and firmware configured to retrieve a codeblock of soft-decision bits from the input buffer memory 202. The processing loop module 220 is also comprised of hardware and firmware configured to perform a decoding operation based on a decoding algorithm. The decoding algorithm can be selected as a maximum aposteriori probability (MAP) based decoding algorithm. In this regard, it should be understood that the processing loop module 220 is comprised of an inner decoder module 204, a depermutation module 106, an outer decoder module 208, and a permutation module 104.

As shown in FIG. 2, the inner decoder module 204 is coupled to the input buffer memory 202, the permutation module 104, and the depermutation module 106. The inner decoder module 204 is comprised of hardware and firmware configured to receive two (2) or more codeblock segments communicated, in parallel, from the input buffer memory 202. The inner decoder module 204 is also comprised of hardware and firmware configured to receive two (2) or more soft-decision bits communicated, sequentially, from the permutation module 104. The inner decoder module 204 is further comprised of hardware and firmware configured to process soft-decision bits contained in a codeblock segment received from the input buffer memory 202. Similarly, the inner decoder module 204 is further comprised of hardware and firmware configured to process soft-decision bits received from the permutation module 104. The inner decoder module 204 is comprised of hardware and firmware configured to communicate, in parallel, processed soft-decision bits to the depermutation module 106. The inner decoder module 204 will be described in greater detail below in relation to FIG. 3.

The depermutation module 108 is comprised of hardware and firmware configured to receive processed soft-decision bits communicated from the inner decoder module 204. The depermutation module 100 is also comprised of hardware and firmware configured to serially link two or more soft-decision bits together to form a codeword segment. The depermutation module 108 is further comprised of hardware and firmware configured to sequentially forward codeword segments to a depermutation buffer memory (described below in relation to FIG. 4) for storage.

As shown in FIG. 2, the depermutation module 106 is coupled to the outer decoder module 208. In this regard, it should be appreciated that the depermutation module 106 is comprised of hardware and firmware configured to retrieve codeword segments from the depermutation buffer memory (described below in relation to FIG. 4). In this regard, it should be appreciated that the codeword segments are read from the depermutation buffer memory in an order different from an order in which the codeword segments were written to the depermutation buffer memory for storage. The depermutation module 106 is further comprised of hardware and firmware configured to break a retrieved codeword segment into a plurality of soft-decision bits. The depermutation module 106 is comprised of hardware and firmware configured to communicate, in parallel, the soft-decision bits to the outer decoder module 208 for processing. The depermutation module 106 will be described in greater detail below in relation to FIG. 4.

The outer decoder module 208 is comprised of hardware and firmware configured to receive soft-decision bits communicated from the depermutation module 106. The outer decoder module 208 is also comprised of hardware and firmware configured to simultaneously process the soft-decision bits received from the depermutation module 106. The outer decoder module 208 is further comprised of hardware and firmware configured to communicate two (2) or more processed soft-decision bits to the permutation module 104 or the output buffer memory 212. The outer decoder module 208 will be described in greater detail below in relation to FIG. 5.

The permutation module 104 is comprised of hardware and firmware configured to receive processed soft-decision bits communicated from the outer decoder module 208. The permutation module 104 is also comprised of hardware and firmware configured to serially link two or more soft-decision bits together to form a codeword segment. The permutation module 104 is further comprised of hardware and firmware configured to sequentially forward codeword segments to a permutation buffer memory (described below in relation to FIG. 6) for storage.

As shown in FIG. 2, the permutation module 104 is coupled to the inner decoder module 204. In this regard, it should be appreciated that the permutation module 104 is comprised of hardware and firmware configured to retrieve codeword segments from the permutation buffer memory (described below in relation to FIG. 6). In this regard, if should be appreciated that the codeword segments are read from the permutation buffer memory in an order different from an order in which the codeword segments were written to the permutation buffer memory for storage. The permutation module 104 is further comprised of hardware and firmware configured to break a codeword segment into a plurality of soft-decision bits. The permutation module 104 is comprised of hardware and firmware configured to communicate the soft-decision bits to the inner decoder module 204 for processing. The permutation module 104 will be described in greater detail below in relation to FIG. 6.

Figure 3:
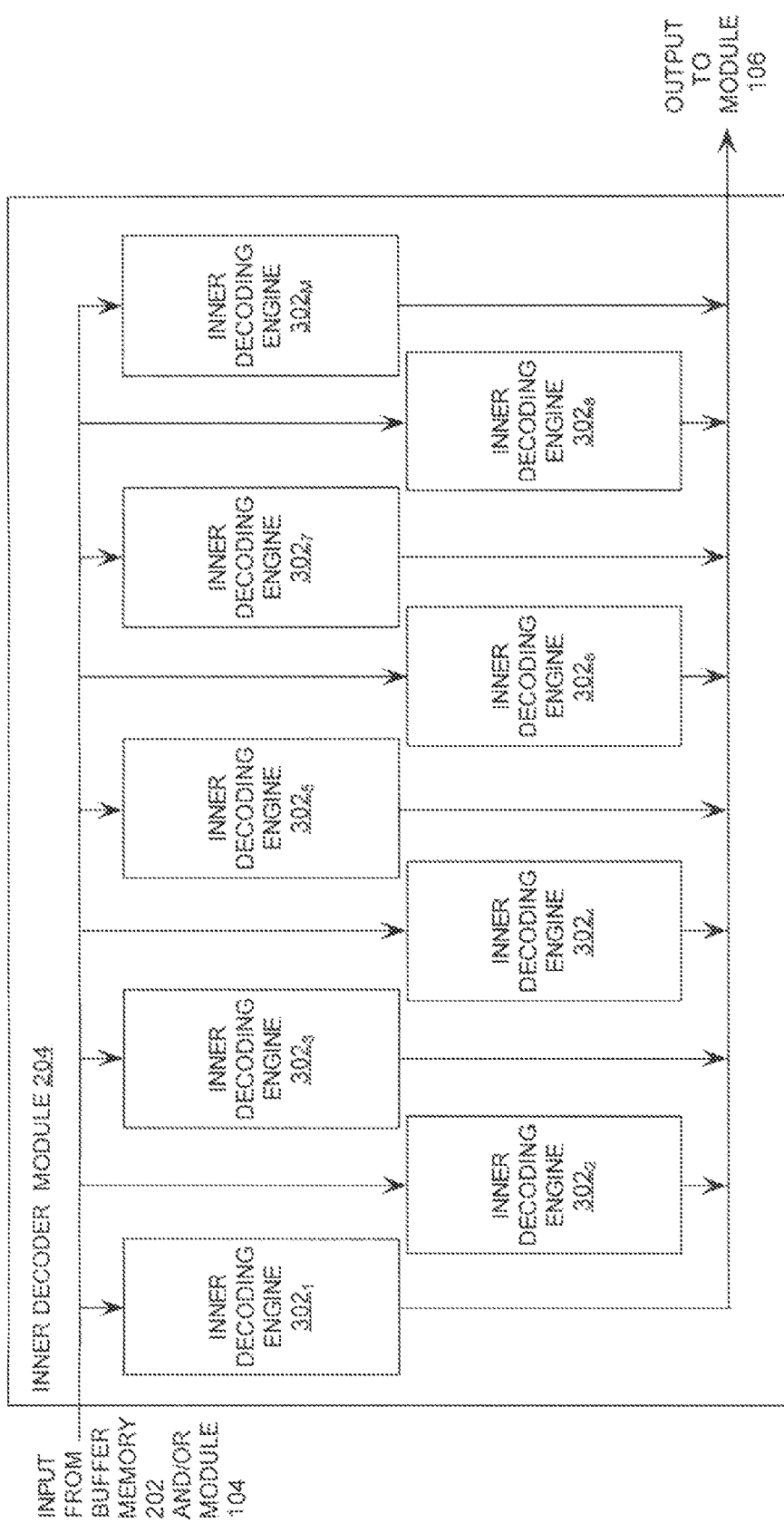
FIG. 3 is a detailed block diagram of a specific realization of an inner decoder module that is useful for understanding the invention.

Referring now to FIG. 3, there is provided a detailed block diagram of an inner decoder module 204 that is useful for understanding the invention. As shown in FIG. 3, the inner decoder module 204 is subdivided into 'M' inner decoding engines $302_1$-$302_M$. The inner decoding engines $302_1$-$302_M$ are configured to concurrently perform a decoding operation based on a decoding algorithm. According to an embodiment of the invention, the inner decoder module 204 is a maximum aposteriori probability (MAP) based decoder. Accordingly, the decoding engines $302_1$-$302_M$ can each be configured with a MAP decoding algorithm. MAP based decoders are well known to persons skilled in the art. Thus, MAP based decoders will not be described in great detail herein. However, it should be appreciated that the present invention is not limited in this regard. It should also be appreciated that such a multi-inner decoding engine architecture provides an improved processing time feature to the inner decoder module 204, i.e., the inner decoder module 204 can process more soft-decision bits in the same amount of time as a conventional inner decoder module.

The inner decoder module 204 can further include a device (not shown) configured to simultaneously retrieve 'M' codeblock segments from the input buffer memory 202. The device can also be configured to forward a particular codeblock segment of the 'N' codeblock segments to a certain inner decoding engine $302_1$-$302_M$. The device can further foe configured to communicate, in parallel, 'M' codeblock segments to 'M' inner decoding engines $302_1$-$302_M$, respectively.

Figure 4:
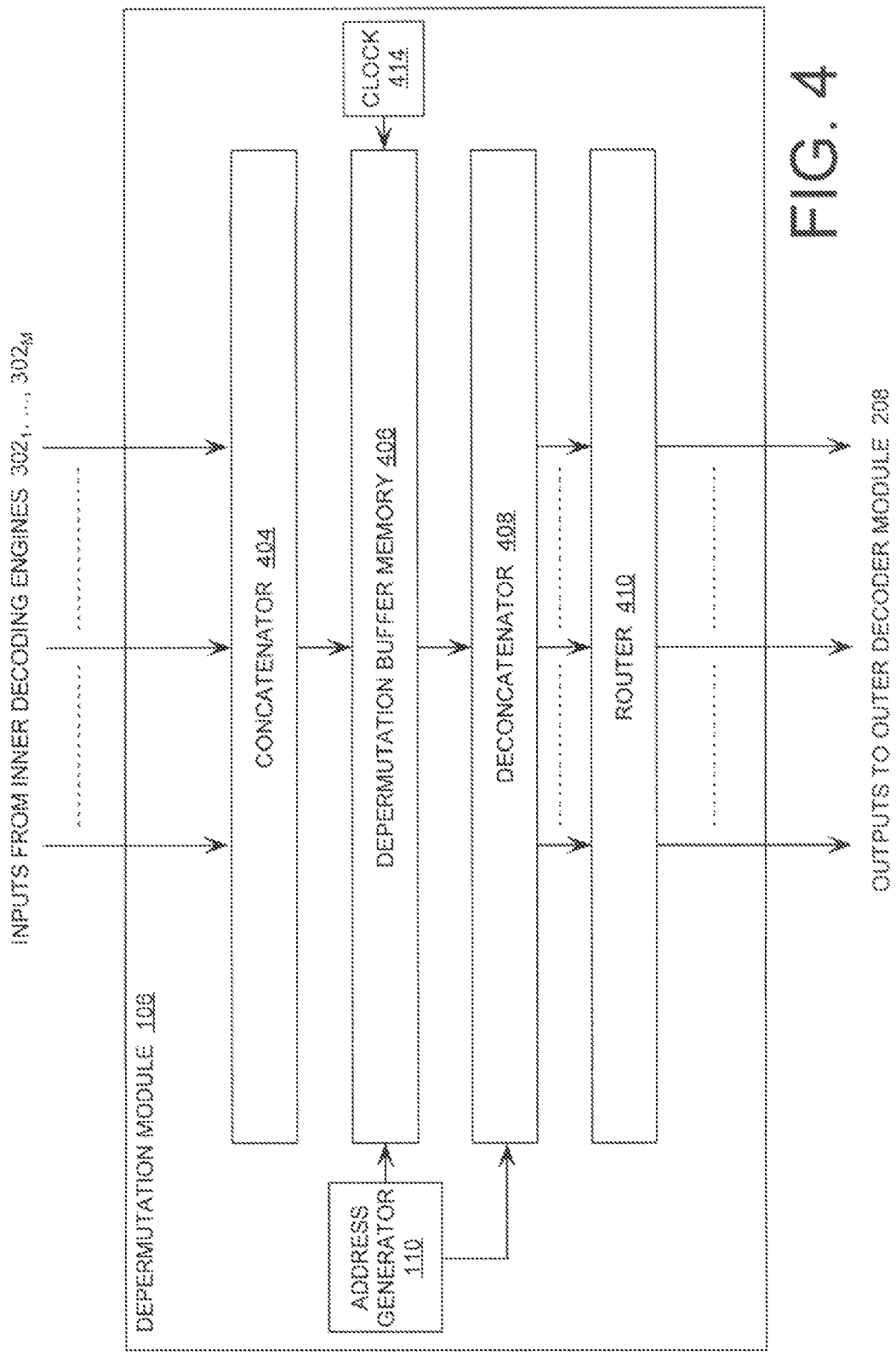
FIG. 4 is a detailed block diagram of a depermutation module that is useful for understanding the invention.

Referring now to FIG. 4, there is provided a detailed block diagram of a depermutation module 106 that is useful for understanding the invention. As shown in FIG. 4, the depermutation module 106 is comprised of a concatenate 404, a depermutation buffer memory 406, a deconcatenator 408, a router 410, a clock 414, and an address generator 110. Each of these components is well known to a person skilled in the art. Thus, the listed components will not be described in great detail herein. However, a brief description of the listed components is provided below to assist a reader in understanding the present invention.

Referring again to FIG. 4, the concatenate 404 is comprised of hardware and firmware configured to receive soft-decision bits communicated, in parallel, from each inner decoding engine $302_1$-$302_M$ (described above in relation to FIG. 3). The concatenate 404 is also comprised of hardware and firmware configured to serially link the soft-decision bits received from the inner decoding engines $302_1$-$302_M$ to form a codeword segment. The concatenate 404 is further comprised of hardware and firmware configured to sequentially forward codeword segments to the depermutation buffer memory 406 for storage.

The address generator 110 is comprised of hardware and/or firmware configured to determine memory location addresses for writing codeword segments to the depermutation buffer memory 406. In this regard, it should be understood that the address generator 110 queries the data store 114 (described above in relation to FIG. 1) for address data. The address generator 110 uses this address data to generate a plurality of sequentially ordered memory location addresses for storing codeword segments in the depermutation buffer memory 406.

The deconcatenator 408 is comprised of hardware and firmware configured to sequentially retrieve codeword segments from the depermutation buffer memory 406. However, it should be understood that the codeword segments are read from the depermutation buffer memory 406 in an order different from an order in which the codeword segments were written to the depermutation buffer memory 406 for storage. The order in which codeword segments are read from memory 406 is determined by the address generator 110.

The address generator 110 is comprised of hardware and/or firmware configured to determine memory location addresses for reading codeword segments from the depermutation buffer memory 406. In this regard, it should be understood that the address generator 110 queries the data store 114 (described above in relation to FIG. 1) for inverse permutation data. The address generator 110 uses this inverse permutation data to generate a plurality of non-sequentially ordered memory location addresses for retrieving codeword segments from the depermutation buffer memory 406.

The deconcatenator 408 is also comprised of hardware and firmware configured to break a codeword segment into a plurality of soft-decision bits. The deconcatenator 408 is further comprised of hardware and firmware configured to communicate, in parallel, the soft-decision bits to the router 410. The router 410 is comprised of hardware and firmware configured to communicate, in parallel, the soft-decision bits to an outer decoder module 208 (described above in relation to FIG. 2 and below in relation to FIG. 5).

Figure 5:
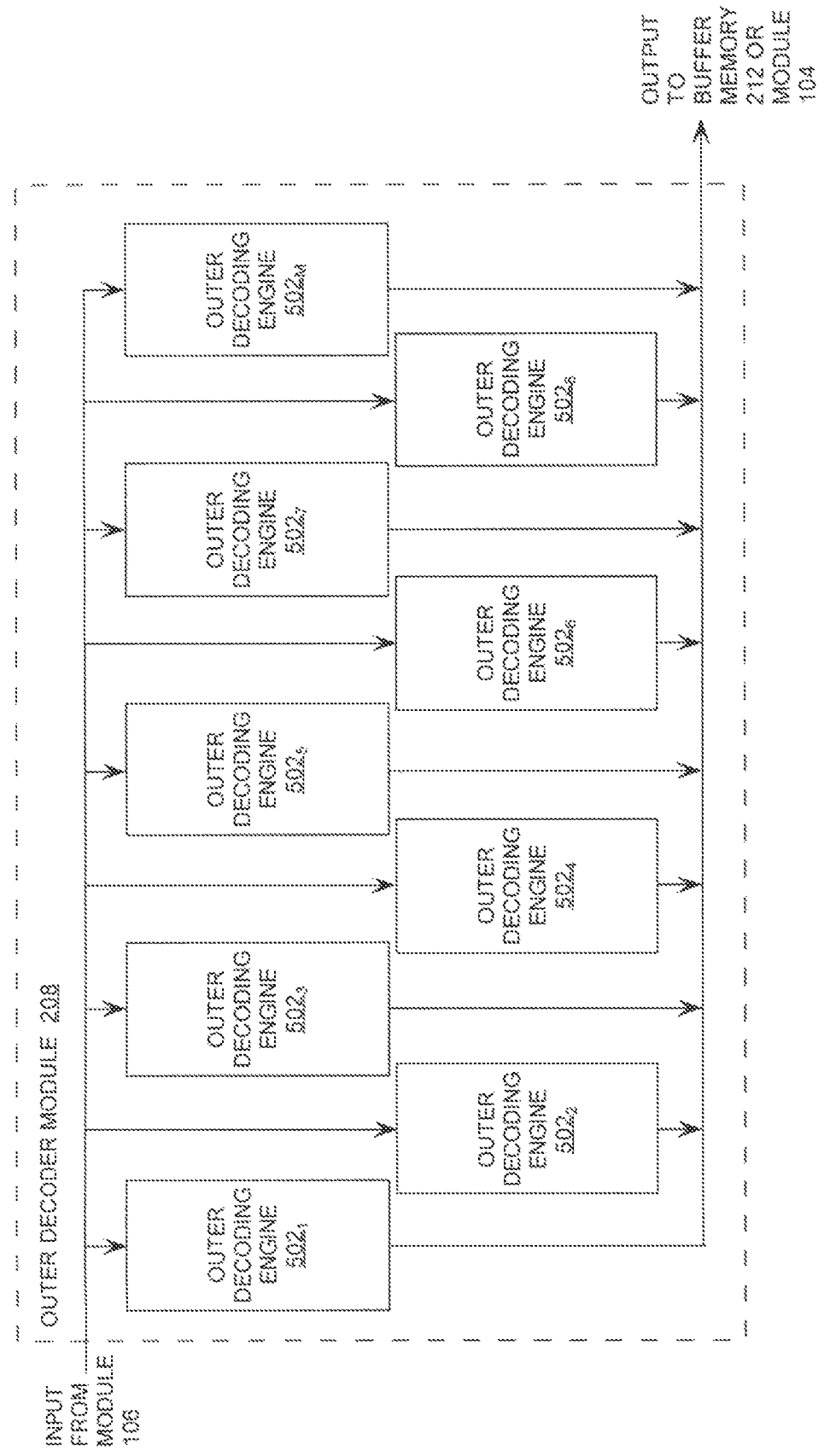
FIG. 5 is a detailed block diagram of a specific realization of an outer decoder module that is useful for understanding the invention.

Referring now to FIG. 5, there is provided a detailed block diagram of an outer decoder module 208 that is useful for understanding the invention. As shown in FIG. 5, the outer decoder module 208 is subdivided into 'M' outer decoding engines $502_1$-$502_M$. The outer decoding engines $502_1$-$502_M$ are configured to concurrently perform a decoding operation based on a decoding algorithm. According to an embodiment of the invention, the outer decoder module 208 is a maximum a posteriori probability (MAP) based decoder. Accordingly, the outer decoding engines $502_1$-$502_M$ can each be configured with a MAP type decoding algorithm. MAP based decoders are well known to persons skilled in the art. Thus, MAP based decoders will not be described in greet detail herein. However, it should be appreciated that the present invention is not limited in this regard. It should also be appreciated that such a multi-outer decoding engine architecture provides an improved processing time feature to the outer decoder module 208, i.e., the outer decoder module 208 can process more soft-decision bits in the same amount of time as a conventional outer decoder module.

The outer decoder module 208 can include a device (not shown) configured to sequentially communicate 'M' codeword segments to an output buffer memory 212 (described above in relation to FIG. 2) for storage. The outer decoder module 208 can also include a device configured to concatenate 'M' codeword segments to form a single codeword. The outer decoder module 208 can also include a device configured to communicate a codeword to art output buffer memory 212 for storage.

Referring now to FIG. 6, there is provided a detailed block diagram of a permutation module 104 that is useful for understanding the invention. As shown in FIG. 6, the permutation module 104 is comprised of a concatenator 604, a permutation buffer memory 606, a deconcatenator 608, a router 610, a clock 614, and an address generator 108. Each of these components is well known to a person skilled in the art. Thus, the listed components will not be described in great detail herein. However, a brief description of the listed components is provided below to assist a reader in understanding the present invention.

Referring again to FIG. 6, the concatenator 604 is comprised of hardware and firmware configured to receive soft-decision bits communicated, in parallel, from each outer decoding engine $502_1$-$502_M$ (described above in relation to FIG. 5). The concatenator 604 is also comprised of hardware and firmware configured to serially link the soft-decision bits received from the outer decoding engines $502_1$-$502_M$ form a codeword segment. The concatenator 604 is further comprised of hardware and firmware configured to sequentially forward codeword segments to the permutation buffer memory 606 for storage.

The address generator 108 is comprised of hardware and/or firmware configured to determine memory location addresses for storing codeword segments in the permutation buffer memory 606. In this regard, it should be understood that the address generator 108 queries the data store 114 (described above in relation to FIG. 1) for address data. The address generator 108 uses this address data to generate a plurality of sequentially ordered memory location addresses for storing codeword segments in the permutation buffer memory 606.

The deconcatenator 608 is comprised of hardware and firmware configured to sequentially retrieve codeword segments from the permutation buffer memory 606. However, it should be understood that the codeword segments are read from the permutation buffer memory 606 in an order different from an order in which the codeword segments are written to the permutation buffer memory 606 for storage. The order in which codeword segments are read from memory 606 is determined by the address generator 108.

The address generator 108 is comprised of hardware and/or firmware configured to determine memory location addresses for reading codeword segments from the permutation buffer memory 606. In this regard, it should be understood that the address generator 108 queries the data store 114 (described above in relation to FIG. 1) for permutation data. The address generator 110 uses this permutation data to generate a plurality of non-sequentially ordered memory location addresses for retrieving codeword segments from the permutation buffer memory 606.

The deconcatenator 608 is also comprised of hardware and firmware configured to break a retrieved codeword segment into a plurality of soft-decision bits. The deconcatenator 608 is further comprised of hardware and firmware configured to communicate, in parallel, the soft-decision bits to the router 610. The router 610 is comprised of hardware and firmware configured to communicate, in parallel, the soft-decision bits to a respective inner decoding engine $302_1$-$302_M$ (described above in relation to FIG. 3).

Figure 7A:
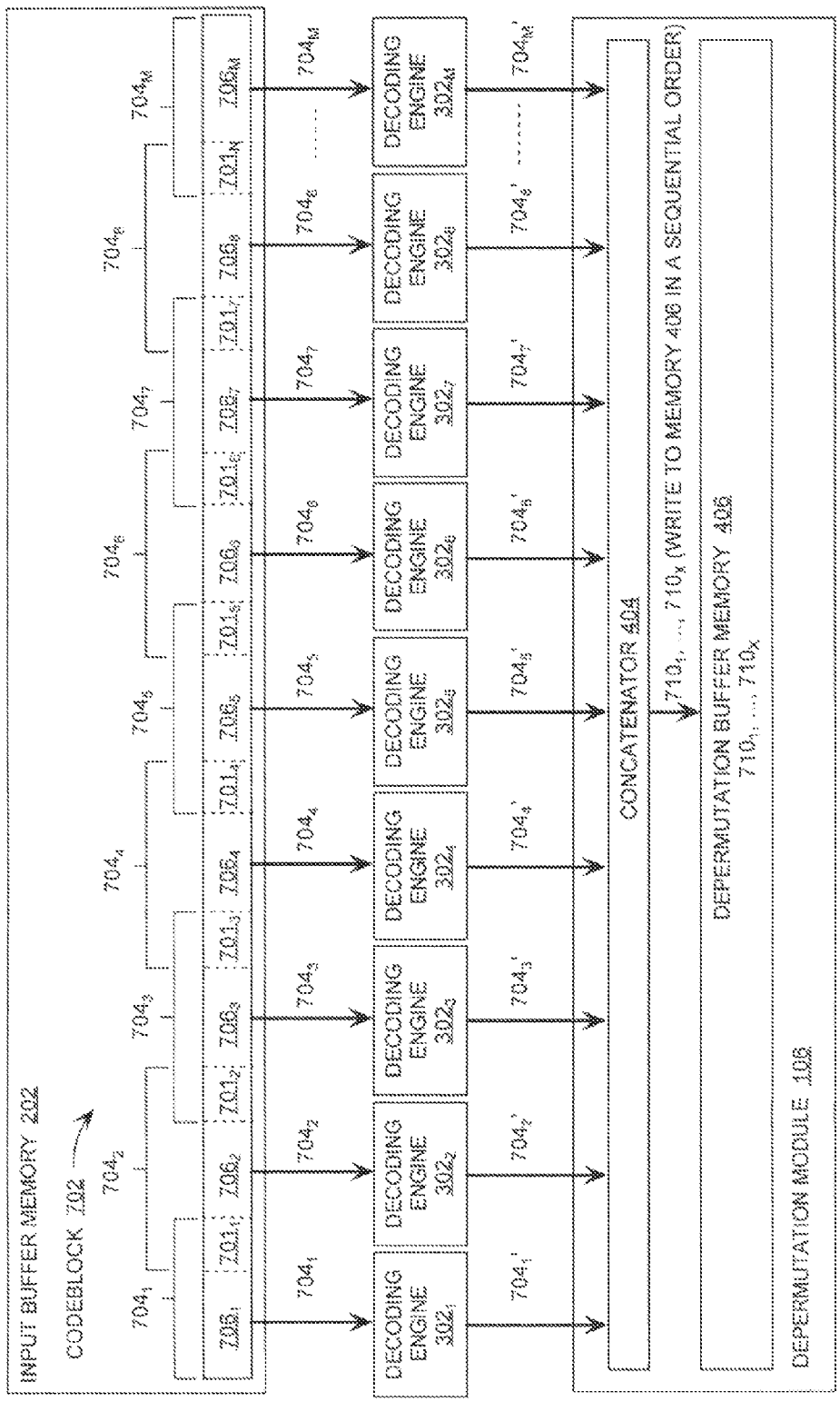
FIGS. 7A-7C collectively illustrate an operation of an SCCC decoder that is useful for understanding the invention.

The operation of the SCCC decoder 102 will now be described in detail with regards to FIG. 7A through FIG. 7C. As shown in FIG. 7A, a codeblock 702 is stored in an input buffer memory 202. It should be understood that the codeblock 702 has a block length of 'N', i.e., the codeblock 702 is comprised of 'N' soft-decision bits. For example, the codeblock 702 is comprised of four (4) thousand fifty soft-decision bits. The 'N' soft-decision bits are encoded using a forward error correction (FEC) encoding technique based on a series of convolution codes, separated by a permutation step.

Referring again to FIG. 7A, the codeblock 702 is comprised of 'M' codeblock segments $704_1$-$704_M$. Each codeblock segment $704_1$-$704_M$ is comprised of one (1) or more overlap bit portions $701_1$-$701_M$ and a non-overlap bit portion $706_1$-$706_M$. For example, the codeblock segment $704_2$ is comprised of a front-end overlap bit portion $701_1$, a non-overlap bit portion $706_2$, and a back-end overlap bit portion $701_2$. It should be appreciated that each overlap bit portion $701_1$-$701_M$ is comprised of a number of soft-decision bits in accordance with a particular decoding scheme implemented in a SCCC decoder 102. It should also be appreciated that each overlap bit portion $701_1$-$701_M$ includes soft-decision bits contained within two (2) or more codeblock segments $704_1$-$704_M$. It should further be appreciated that each non-overlap bit portion $704_1$-$704_M$ includes soft-decision bits contained within a single codeblock segment $704_1$-$704_M$.

As shown in FIG. 7A, each inner decoding engine $302_1$-$302_M$ retrieves, in parallel, a respective codeblock segment $704_1$-$704_M$ from the input buffer memory 202. For example, the inner decoding engine $302_1$ retrieves a codeblock segment $704_1$ from an input buffer memory 202 location having a first address. Similarly, the inner decoding engine $302_2$ retrieves a codeblock segment $704_2$ from an input buffer memory 202 location having a second address. Likewise, each inner decoding engine $302_3$-$302_M$ retrieves a respective codeblock segment $704_3$-$704_M$ from input buffer memory 202 locations having different addresses.

However, it should be understood that each inner decoding engine $302_1$-$302_M$ retrieves a codeblock segment $704_1$-$704_M$ in a clock cycle by clock cycle, bit(s) by bit(s) manner. For example, the inner decoding engine $302_2$ receives a first one or a first set of soft-decision bits included in the front-end overlap bit portion $701_1$ during a first clock cycle. Thereafter, the inner decoding engine $302_2$ receives a second one or a second set of soft-decision bits included in the front end overlap bit portion $701_1$ during a second clock cycle. Subsequently, the inner decoding engine $302_2$ receives a third one or a third set of soft-decision bits included in the non-overlap bit portion $706_2$ during a third clock cycle, and so on.

Upon receipt of a first bit or a first set of soft-decision bits, each inner decoding engine $302_1$-$302_M$ begins performing a decoding operation based on an inner convolutional code. The decoding operation is performed to partially decode soft-decision bits contained within a respective codeblock segment $704_1$-$704_M$. According to an embodiment of the invention, each inner decoding engine utilizes a maximum a posteriori probability (MAP) decoding algorithm designed in accordance with the inner convolutional code. As will be understood by a person skilled in the art, there are many MAP based decoding algorithms that can be implemented within an inner decoding engine $302_1$-$302_M$. Any such MAP based decoding algorithm can be used without limitation, provided that it corresponds to a particular encoding scheme used for encoding information bits contained within the codeblock 702.

Referring again to FIG. 7A, each inner decoding engine $302_1$-$302_M$ concurrently processes soft-decision bits contained within a respective codeblock segment $704_1$-$704_M$. In this regard, it should be appreciated that the inner decoding engines $302_1$-$302_M$ do not produce outputs corresponding to all soft-decision bits contained within an overlap bit portion $701_1$-$701_M$. In effect, the inner decoding engines $302_1$-$302_M$ avoid an error rate increase that would otherwise occur with codeblock segmentation. For example, the inner decoding engine $302_2$ does not produce an output corresponding to a first sixteen (16) soft-decision bits of the front-end overlap bit portion $701_1$ and a last sixteen (16) soft-decision bits of the back-end overlap bit portion $701_2$. As such, the inner decoding engine $302_2$ outputs a processed codeblock segment $704_2'$ that is absent of the first sixteen (16) soft-decision bits of the front-end overlap bit portion $701_1$ and the last sixteen (16) soft-decision bits of the back-end overlap bit portion $701_2$. Still, the invention is not limited in this regard.

After concurrently processing soft-decision bits contained within a respective codeblock segment $704_1$-$704_M$, the inner decoding engines $302_1$-$302_M$ communicate, in parallel, the processed codeblock segments $704_1'$-$704_M'$ to a concatenator 404 of the depermutation module 106. In this regard, it should be appreciated that the processed codeblock segments $704_1'$-$704_M'$ are communicated to the concatenator 404 in a clock cycle by clock cycle, sequential bit by bit manner. For example, a first soft-decision bit of each processed codeblock segment $704_1'$-$704_M'$ is communicated, in parallel, to the concatenator 404 in a first clock cycle. A second soft-decision bit of each processed codeblock segment $704_1'$-$704_M'$ is communicated, in parallel, to the concatenator 404 in a second clock cycle, and so on.

Upon receipt of a first soft-decision bit from each inner decoding engine $302_1$-$302_M$, the concatenator 404 serially links the same together to form a first codeword segment $710_1$ comprised of 'M' decoded soft-decision bits. Thereafter, the concatenator 404 forwards the first codeword segment $710_1$ to the depermutation buffer memory 406 for storage. Similarly, the concatenator 404 serially links a set of second soft-decision bits received from the inner decoding engines $302_1$-$302_N$ to form a second codeword segment $710_2$ comprised of 'M' decoded soft-decision bits. Once the second codeword segment $710_2$ is formed, the concatenator 404 forwards the second codeword segment $710_2$ to the depermutation buffer memory 406 for storage. The concatenator 404 repeats this process until all soft-decision bits contained in each codeblock segment $704_1'$-$704_M'$ have been communicated to the concatenator 404 and forwarded to the depermutation buffer memory 406 for storage as codeword segments $710_3$-$710_X$.

Figure 7B:
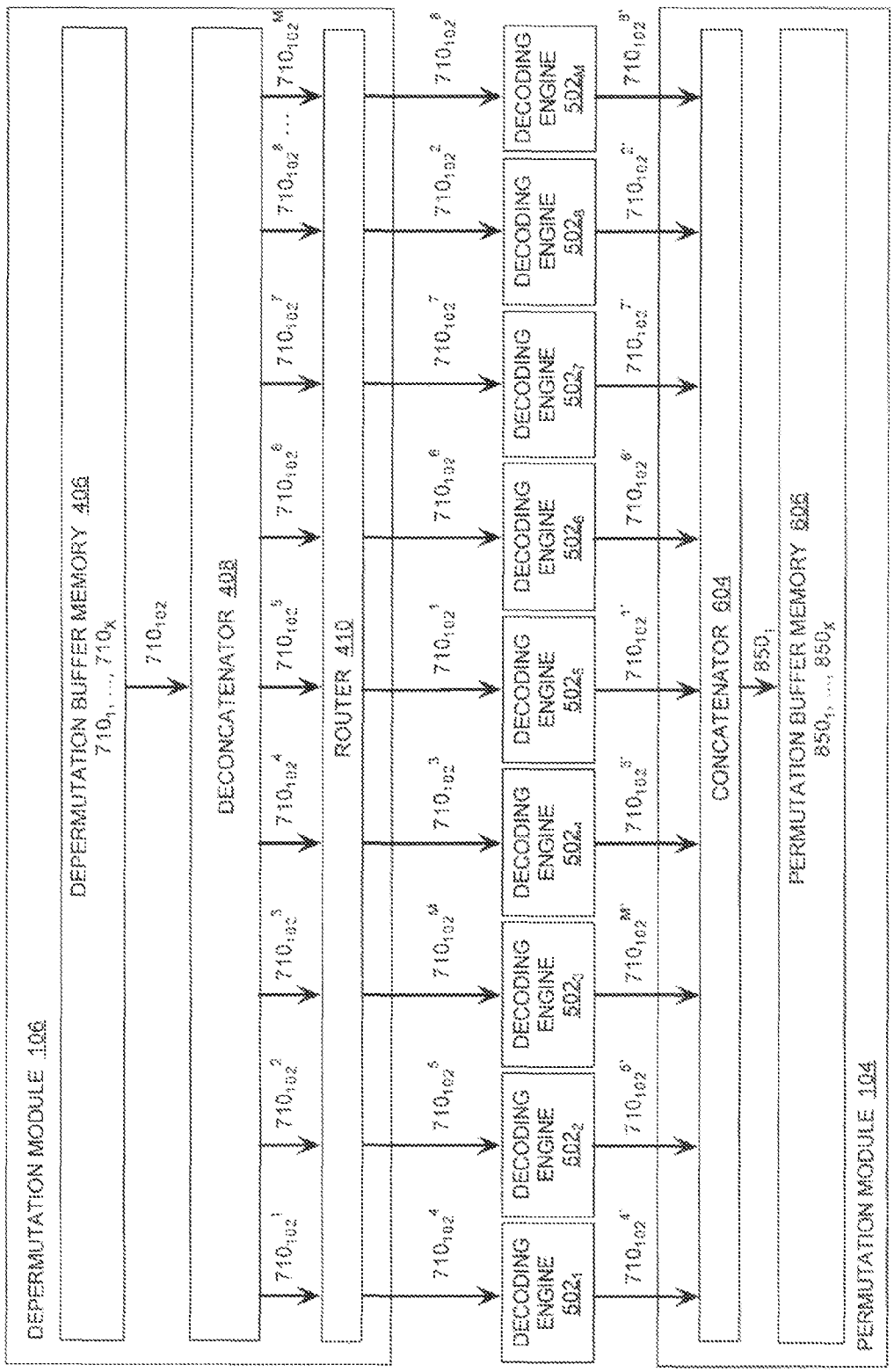

As shown in FIG. 7B, the depermutation module 106 is coupled to each outer decoding engine $502_1$-$502_M$. As such, the deconcatenator 408 sequentially retrieves codeword segments $710_1$-$710_X$ from a depermutation buffer memory 406. In this regard, it should be understood that the deconcatenator 408 retrieves a single codeword segment per clock cycle. For example, the deconcatenator 408 retrieves a codeword segment $710_{102}$ during a first clock cycle. The deconcatenator 408 retrieves a codeword segment $710_4$ during a second clock cycle, and so on.

It should also be understood that the codeword segments $710_1$-$710_X$ are retrieved from the depermutation buffer memory 406 in an order different from the order in which the codeword segments $710_1$-$710_X$ were written to the depermutation buffer memory 406 for storage. As will be understood by a person skilled in the art, the order in which the codeword segments $710_1$-$710_X$ are retrieved from the depermutation buffer memory 406 is determined by the address generator 110 (described above in relation to FIG. 4) using inverse permutation data contained in a data store 114 (described above in relation to FIG. 1) of the decoding system 100. For example, the address generator 110 retrieves inverse permutation data from the data store 114 and performs processing on the inverse permutation data to generate a plurality of non-sequentially ordered depermutation buffer memory 406 location addresses.

Once the deconcatenator 408 receives a codeword segment $710_{102}$, the deconcatenator 408 performs processing on the codeword segment $710_{102}$ to break the codeword segment $710_{102}$ into a plurality of soft-decision bits. After processing a received codeword segment $710_{102}$, the deconcatenator 408 communicates, in parallel, the soft-decision bits $710_{102}{}^1, \ldots, 710_{102}{}^M$ to a router 410. In turn, the router 410 communicates, in parallel, each soft-decision bit $710_{102}{}^1, \ldots, 710_{102}{}^M$ to a particular outer decoding engine $502_1$-$502_M$.

Upon receipt of a soft-decision bit, an outer decoding engine $502_1$-$502_M$ begins performing a decoding operation based on a decoding algorithm. For example, a MAP type decoding algorithm can be used for this purpose. This decoding operation is performed for processing a soft-decision bit $710_{102}{}^1, \ldots, 710_{102}{}^M$. In this regard, it should be appreciated that the outer decoding engines $502_1$-$502_M$ are configured to concurrently process respective soft-decision bits $710_{102}{}^1, \ldots, 710_{102}{}^M$. After processing the soft-decision bits $710_{102}{}^1, \ldots, 710_{102}{}^M$, the outer decoding engines $502_1$-$502_M$ communicate, in parallel, the processed soft-decision bits $710_{102}{}^{1'}, \ldots, 710_{102}{}^{M'}$ to a concatenator 604 of a permutation module 104. It should be appreciated that the outer decoding engines $502_1$-$502_M$ repeat this process until all soft-decision bits contained in codeword segments $710_1, \ldots, 710_X$ have been processed by a respective outer decoding engine $502_1$-$502_M$ and forwarded to the concatenator 604.

Upon receipt of a processed soft-decision bit $710_{102}{}^{1'}, \ldots, 710_{102}{}^{M'}$ from each outer decoding engine $502_1$-$502_M$, the concatenator 604 serially links the same together to form a codeword segment $850_1$. The concatenator 604 forwards the codeword segment $850_1$ to the permutation buffer memory 606 for storage. The concatenator 604 repeats this process until all the soft-decision bits contained in each codeword segment $710_1, \ldots, 710_X$ have been processed by the outer decoding engines $502_1$-$502_M$, communicated to the concatenated 604, and forwarded to the permutation buffer memory 606 as codeword segments $850_2$-$850_X$.

Figure 7C:
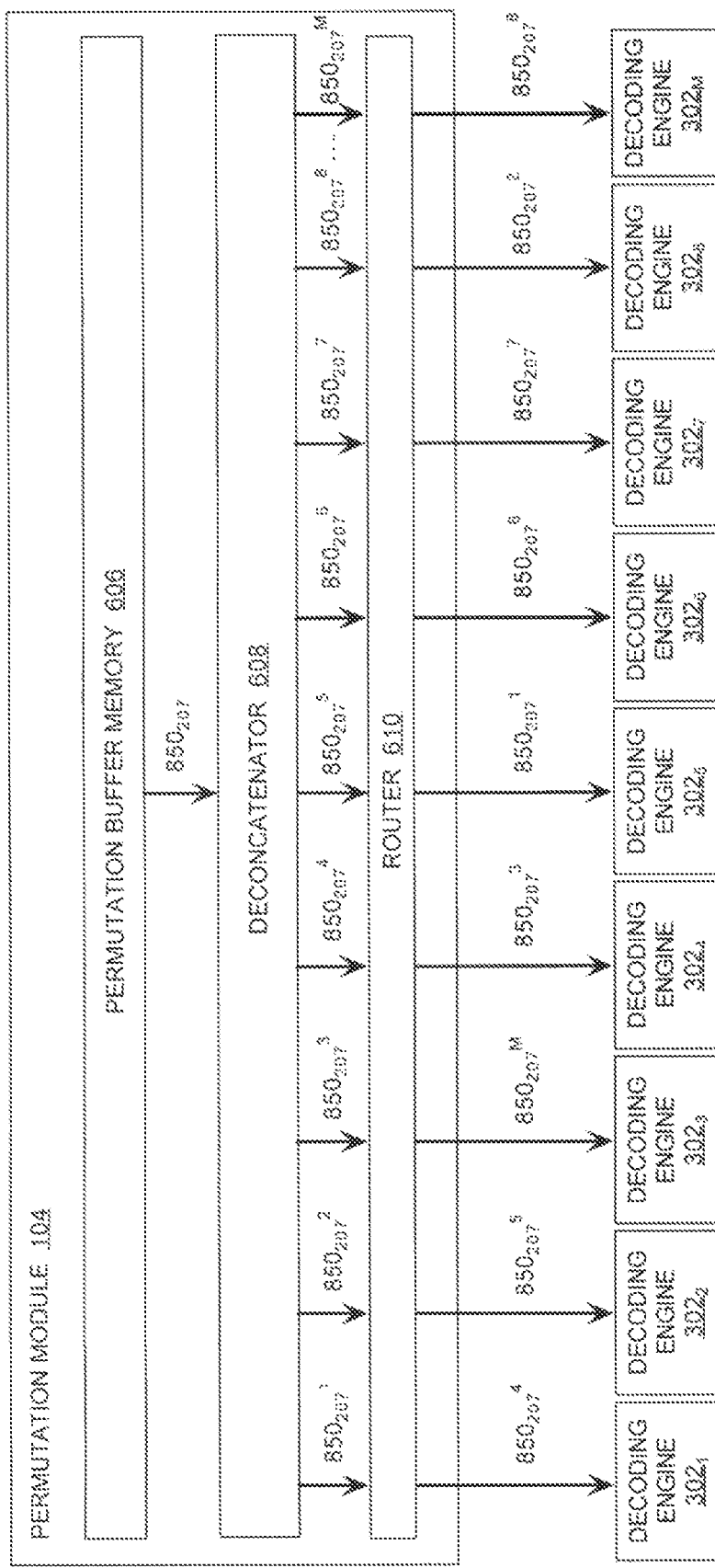

As shown in FIG. 7C, a permutation module 104 is coupled to each inner decoding engine $302_1$-$302_M$. As such, the deconcatenator 608 sequentially retrieves codeword segments $850_1$-$850_X$ from a permutation buffer memory 606. In this regard, it should be understood that the deconcatenator 608 retrieves a single codeword segment per clock cycle. For example, the deconcatenator 608 retrieves a codeword segment $850_{207}$ during a first clock cycle. The deconcatenator 608 retrieves a codeword segment $850_4$ during a second clock cycle, and so on.

It should also be understood that the codeword segments $850_1$-$850_X$ are retrieved from the permutation buffer memory 608 in an order different from the order in which the codeword segments $850_1$-$850_X$ were written to the permutation buffer memory 606 for storage. As will be understood by a person skilled in the art, the order in which the codeword segments $850_1$-$850_X$ are retrieved from the permutation buffer memory 606 is determined by the address generator 108 (described above in relation to FIG. 6) using permutation data stored in a data store 114 (described above in relation to FIG. 1) of the decoding system 100. For example, the address generator 108 retrieves permutation data from the data store 114 and performs processing on the permutation data to generate a plurality of non-sequentially ordered permutation buffer memory 606 location addresses.

Once the deconcatenator 608 receives a codeword segment $850_{207}$, the deconcatenator 608 performs processing on the codeword segment $850_{207}$ to break the codeword segment $850_{207}$ into a plurality of soft-decision bits. After processing the codeword segment $850_{207}$, the deconcatenator 608 forwards the soft-decision bits $850_{207}^1, \ldots, 850_{207}^M$ to a router 610. In turn, the router 610 communicates, in parallel, the soft-decision bits $850_{207}^1, \ldots, 850_{207}^M$ to a particular inner decoding engine $302_1$-$302_M$.

Constrained Permutation Table

A constrained permutation table ensures that a set of soft-decision bits which are to be processed at the same time by the outer/inner decoding engines $302_1$-$302_M$, $502_1$-$502_M$ (described above in relation to FIG. 3 and FIG. 5) are written to a buffer memory 406, 606 (described above in relation to FIG. 4 and FIG. 8) location having a single address. The constrained permutation table also ensures that a single read from each of the buffer memories 406, 606 is required per decoding cycle.

Referring now to FIG. 8, there is provided a block diagram of a serially concatenated convolutional code (SCCC) encoder 800 that is useful for understanding the present invention. As should be understood, the SCCC encoder 800 performs processing on input data to encode the same prior to its transmission to the decoding system 100 (described above in relation to FIG. 1). This processing involves performing a forward error correction (FEC) encoding technique based on a series of convolutional codes, separated by a permutation step.

Referring again to FIG. 8, the SCCC encoder 800 is comprised of an outer encoder module 802, a permutation module 804, an inner encoder module 806, and a memory 808. The memory 808 has address data and normal permutation data stored therein according to a table format. This table is herein after referred to as a permutation table. The address data includes information necessary for reading and writing data to memory 810 in a predetermined order for causing a re-ordering of a sequence of information bits x[n]. By reordering the information bits in the sequence x[n], two short convolutional encoders 802, 806 can be used to produce a code with a large spread, resulting in excellent coding gain.

As shown in FIG. 8, a sequence of information bits output from the outer encoder module 802 is designated as x[n]. As should be understood, x[0] is a first information bit produced by the outer encoder module 802. x[N−1] is a last information bit produced by the outer encoder module 302. Similarly, a sequence of information bits input to the inner encoder module 806 is designated as y[n]. As should be understood, y[0] is a first information bit input to the inner encoder module 806. y[N−1] is a last information bit input to the inner encoder module 806. N is a known codeblock length times an inverse of a code rate for the outer encoder module 802. For example, if a codeblock length is two thousand twenty-five (2025) and a code rate is one half (½), then N equals four thousand fifty (4050).

The permutation table determines the mapping between x[n] and y[n]. The mapping is defined by the sequence v[n]. Accordingly, for each information bit y[n]=x[v[n]]. The first information bit y[0] input into the inner encoder module 806 is the (v[n]+1)th value output from the outer encoder module 802. In this way, the mapping between x[n] and y[n] (i.e., the permutation step) is entirely defined by a sequence v[n], where n equals $0, \ldots, N-1$. If should be understood that the sequence of values v[n] includes each integer $0, \ldots, N-1$ exactly once thereby preventing information from being lost or repeated during a mapping between x[n] and y[n]. As such, there is a one-to-one correspondence between the sequence of values v[n] and the integers $0, \ldots, N-1$.

Referring now to FIG. 9, there is provided an illustration of two code blocks which are related based on a defined mapping scheme. As noted above, x[n] is a sequence of information bits x[0], ..., x[N−1]. The information bits x[0], ..., x[N−1] are sequentially ordered within the sequence x[n]. As such, the information bit x[0] resides at a position one (1) within the sequence x[n]. The information bit x[1] resides at a position two (2) within the sequence x[n], and so on.

As shown in FIG. 9, a permutation of the information bits x[0], ..., x[N−1] is defined by a mathematical Equation (1).

$$y[n]=x[v[n]] \qquad (1)$$

where y[n] is a sequence of permuted (i.e., rearranged or reorganized) information bits x[0], ..., x[N−1]. More particularly, y[n] is a sequence of information bits y[0], ..., y[N−1]. The information bits y[0], ..., y[N−1] are non-sequentially ordered within the sequence y[n].

A depermutation of the information bits y[0], ..., y[N−1] is defined by a mathematical Equation (2).

$$x[n]=y[w[n]] \qquad (2)$$

where x[n] is a sequence of depermuted information bits y[0], ..., y[N−1], w[n] is a sequence of values that is an inverse of the sequence of values v[n].

By substituting mathematical Equation (2) into mathematical Equation (1), mathematical Equation (1) can be rewritten as mathematical Equation (3).

$$y[n]=y[w[v[n]]] \qquad (3)$$

In this regard, it should be appreciated that w[v[n]] equals n. If n has a value of eight (8) and v[8] equals one thousand five hundred seventy seven (1577), then w[1577] equals eight (8).

Referring now to FIGS. 10A and 10B, two block diagrams are provided that are useful for understanding how a first and second depermutation table is used in the inventive arrangements. As shown in FIG. 10A, an address generator 110 (described above in relation to FIGS. 1 and 4) uses a first sequence of values $0, \ldots, n-1$ to generate write addresses for a depermutation buffer memory 406 (described above in relation to FIG. 4). The address generator 110 also uses a second sequence w[n] of values w[0], ..., w[n−1] to generate read addresses from the depermutation buffer memory 406. As shown in FIG. 10B, the address generator 110 uses a third sequence v[n] of values v[0], ..., v[n−1] to generate write addresses for the depermutation buffer memory 406. The address generator 110 also uses the first sequence n of values $0, \ldots, n-1$ to generate read addresses from the depermutation buffer memory 406.

Figure 10C:
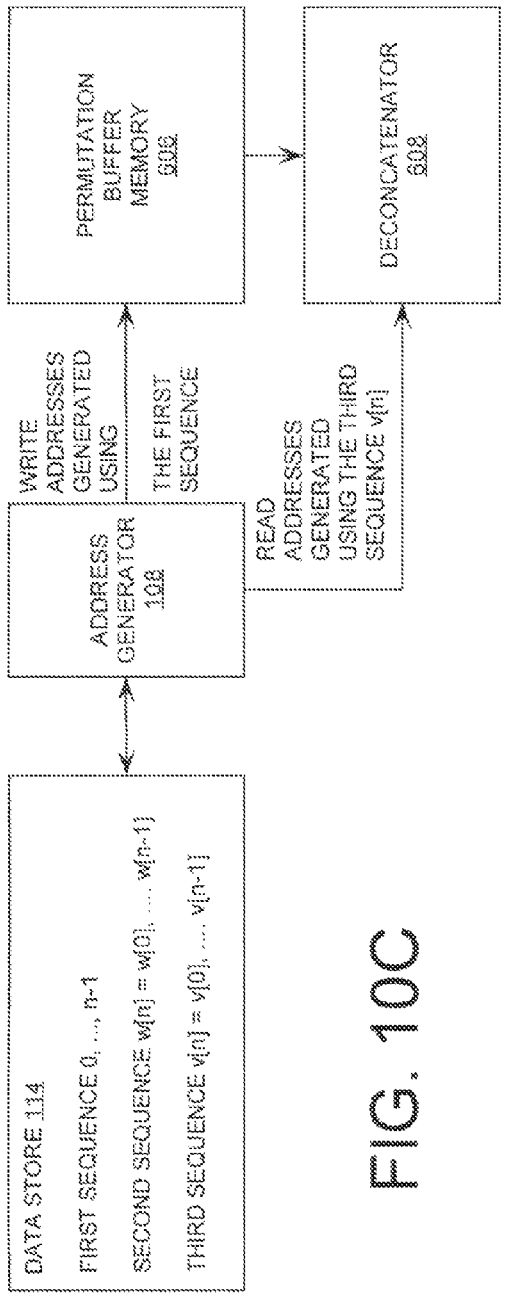
FIG. 10C is a block diagram that is useful for understanding how a first permutation table is used in the inventive arrangements.
Figure 10D:
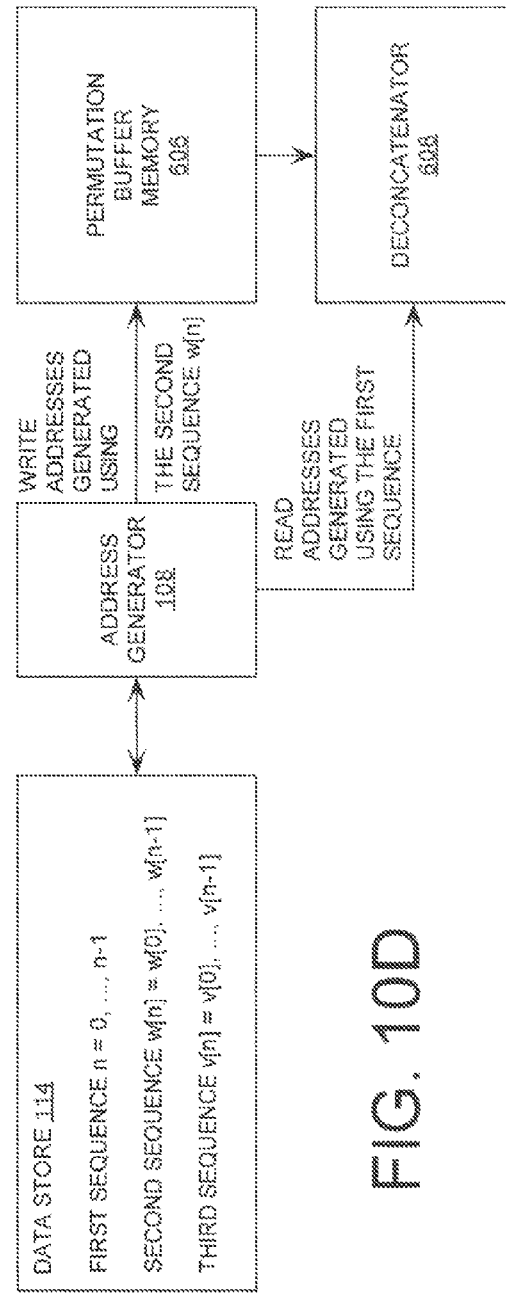
FIG. 10D is a block diagram of that is useful for understanding how a second permutation table is used in the inventive arrangements.

Referring now to FIGS. 10C and 10D, two block diagrams are provided that are useful for understanding how a first and second permutation table is used in the inventive arrangements. As shown in FIG. 10C, an address generator 108 (described above in relation to FIGS. 1 and 6) uses a first sequence of values $0, \ldots, n-1$ to generate write addresses for a permutation buffer memory 606 (described above in relation to FIG. 6). The address generator 108 uses a third sequence v[n] of values v[0], ..., v[n−1] to generate read addresses from the permutation buffer memory 606. As shown in FIG. 10D, the address generator 108 uses the second sequence w[n] of values w[0], ..., w[n−1] to generate write addresses for the permutation buffer memory 606. The address generator 108 uses the first sequence of values $0, \ldots, n-1$ to generate read addresses from the permutation buffer memory 606.

As should be understood, each address generator 108, 110 can employ a variety of methods for generating addresses using a sequence of values. For example, each address generator 108, 110 can employ a method that uses values of a given sequence as actual memory location addresses. Alternatively, each address generator 108, 110 can employ a method that uses values of a sequence to determine actual sequentially or non-sequentially ordered memory location addresses. Still, the invention is not limited in this regard.

Figure 11A:
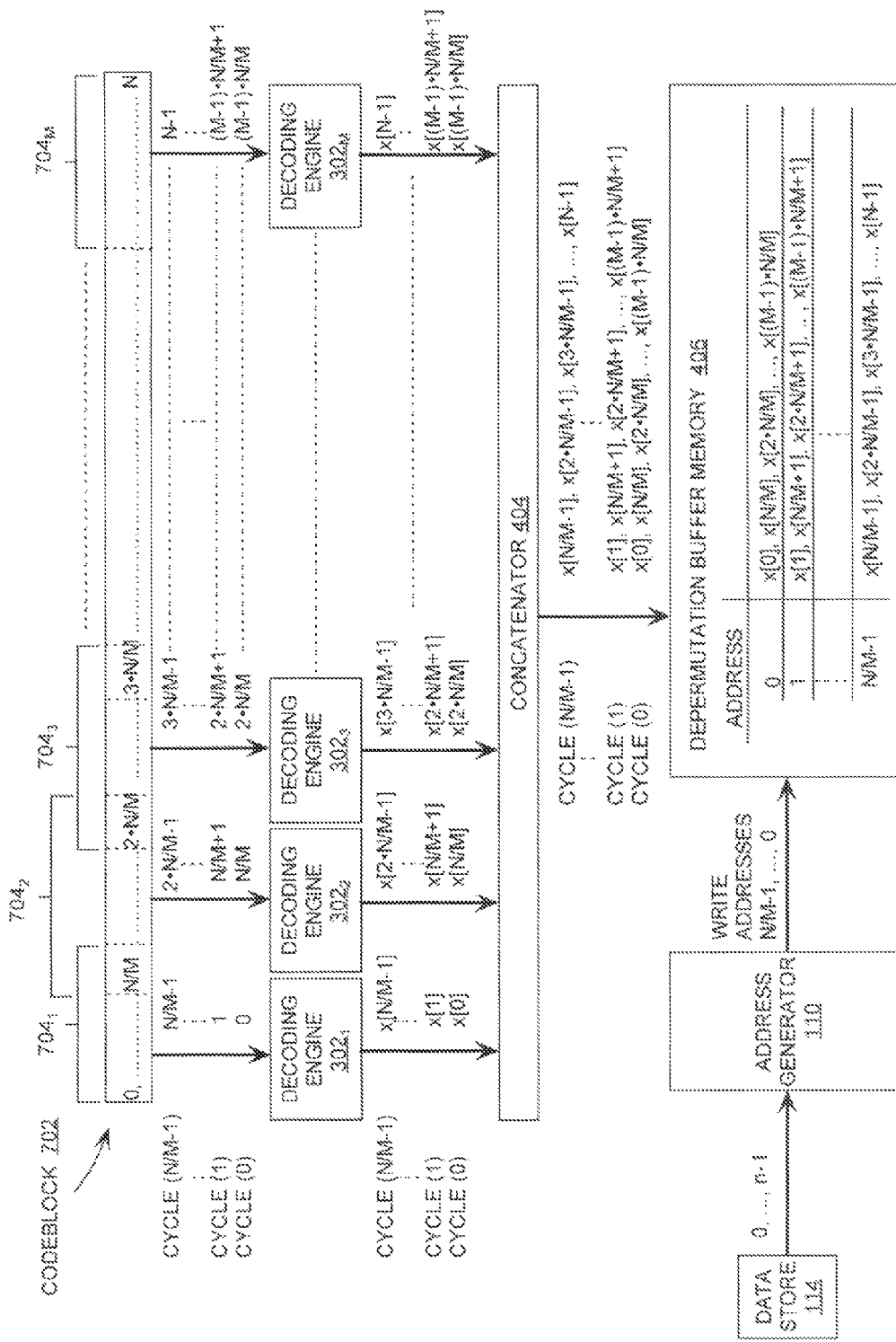
FIGS. 11A-B collectively illustrate an operation of an SCCC decoder having a first depermutation table of FIG. 10A stored therein that is useful for understanding the invention.

Referring now to FIG. 11A, a codeblock 702 (described above in relation to FIG. 7A) is communicated to the inner decoding engines $302_1$-$302_M$ (described above in relation to FIG. 3). The codeblock 702 has a block length of N. The codeblock 702 is comprised of M codeblock segments $704_1$-$704_M$. Each codeblock segment $704_1$-$704_M$ is comprised of N/M soft-decision bits as well as overlapping bits. Each codeblock segment $704_1$-$704_M$ is communicated to a respective one of M inner decoding engines $302_1$-$302_M$. The inner decoding engines $302_1$-$302_M$ (described above in relation to FIG. 3) are M-way parallelized. The phrase "M-way parallelized" as used herein refers to an ability to perform M tasks at the same time. The phrase "M-way parallelized" as used herein also refers to an ability to simultaneously run the same process within more than one processor.

As shown in FIG. 11A, each inner decoding engine $302_1$-$302_M$ receives a codeblock segment $704_1$-$704_M$ in a cycle by cycle, soft-decision bit by soft-decision bit manner. For example, the inner decoding engine $302_1$ receives a soft-decision bit having a position zero (0) in the codeblock 702 during a cycle zero (0). The inner decoding engine $302_1$ receives a soft-decision bit having a position one (1) during a cycle (1), and so on. Similarly, the inner decoding engine $302_2$ receives a soft-decision bit having a position N/M in the codeblock 702 during a cycle zero (0). The inner decoding engine $302_2$ receives a soft-decision bit having a position N/M+1 during a cycle (1), and so on. Likewise, the inner decoding engine $302_3$ receives a soft-decision bit having a position 2·N/M in the codeblock 702 during a cycle zero (0). The inner decoding engine $302_3$ receives a soft-decision bit having a position 2·N/M+1 during a cycle (1), and so on. In the same way, the inner decoding engine $302_M$ receives a soft-decision bit having a position (M−1)·N/M in the codeblock 702 during a cycle zero (0). The inner decoding engine $302_M$ receives a soft-decision bit having a position (M−1)·N/M+1 during a cycle (1), and so on.

Upon receipt of a soft-decision bit, the inner decoding engines $302_1$-$302_M$ concurrently process the soft-decision bits to partially decode the same. After processing the soft-decision bits, the inner decoding engines $302_1$-$302_M$ communicate, in parallel, the processed soft-decision bits to the concatenator 404 (described above in relation to FIG. 4). In this regard, it should be appreciated that the inner decoding engines $302_1$-$302_M$ output processed soft-decision bits in a cycle by cycle, soft-decision bit by soft-decision bit manner. For example, the inner decoding engine $302_1$ outputs a processed soft-decision bit x[0] in a cycle zero (0). The inner decoding engine $302_1$ outputs a processed soft-decision bit x[1] in a cycle one (1), and so on. Similarly, the inner decoding engine $302_2$ outputs a processed soft-decision bit x[N/M] in a cycle zero (0). The inner decoding engine $302_2$ outputs a processed soft-decision bit x[N/M+1] in a cycle one (1). Likewise, the inner decoding engine $302_3$ outputs a processed soft-decision bit x[2+N/M] in a cycle zero (0). The inner decoding engine $302_3$ outputs a processed soft-decision bit x[2−N/M+1] in a cycle one (1), and so on. In the same way, the inner decoding engine $302_M$ outputs a processed soft-decision bit x[(M−1)·N/M] in a cycle zero (0). The inner decoding engine $302_M$ outputs a processed soft-decision bit x[(M−1)·N/M+1] in a cycle one (1), and so on.

Upon receipt of a processed soft-decision bit from each inner decoding engine $302_1$-$302_M$, the concatenator 404 serially links the same together and forwards the serially linked processed soft-decision bits to the depermutation buffer memory 406 for storage. For example, the concatenator 404 serially links the processed soft-decision bits x[0], x[N/M], x[2·N/M], . . . , x[(M−1)·N/M] together in a cycle zero (0) to form a single concatenated codeword segment. The concatenator 404 also forwards the serially linked soft-decision bits x[0], x[N/M], x[2−N/M], . . . , x[(M−1)·N/M] to the depermutation buffer memory 406 in a cycle zero (0). The concatenator 404 serially links the processed soft-decision bits x[1], x[N/M+1], x[2−N/M+1], . . . , x[(M−1)·N/M+1] together in a cycle one (1) to form a single concatenated codeword segment. The concatenator 404 also forwards the serially linked soft-decision bits x[1], x[N/M+1], x[2−N/M+1], . . . , x[(M−1)·N/M+1] to the depermutation buffer memory 406 in a cycle one (1), and so on.

Notably, each set of serially linked soft-decision bits forming a concatenated codeword segment is advantageously stored in the depermutation buffer memory 406 at a single address. The addresses are generated by the address generator 110 using a sequence 0, . . . , n−1 which is stored in a permutation table of the data store 114. As shown in FIG. 11A, the serially linked soft-decision bits x[0], x[N/M], x[2−N/M], . . . , x[(M−1)·N/M] are stored in a memory location having an address zero (0). The serially linked soft-decision bits x[1], x[N/M+1], x[2−N/M+1], . . . , x[(M−1)·N/M+1] are stored in a memory location having an address one (1), and so on.

It should be appreciated that the above described soft-decision bit processing and storage scheme can be generally defined by the following steps:

(1) concatenate soft-decision bits x[n], x[N/M+n], x[2−N/M+n], . . . , x[(M−1)·N/M+n]; and (2) save the concatenated soft-decision bits x[n], x[N/M+n], x[2−N/M+n], . . . , x[(M−1)·N/M+n] in a memory location having an address n.

Figure 11B:
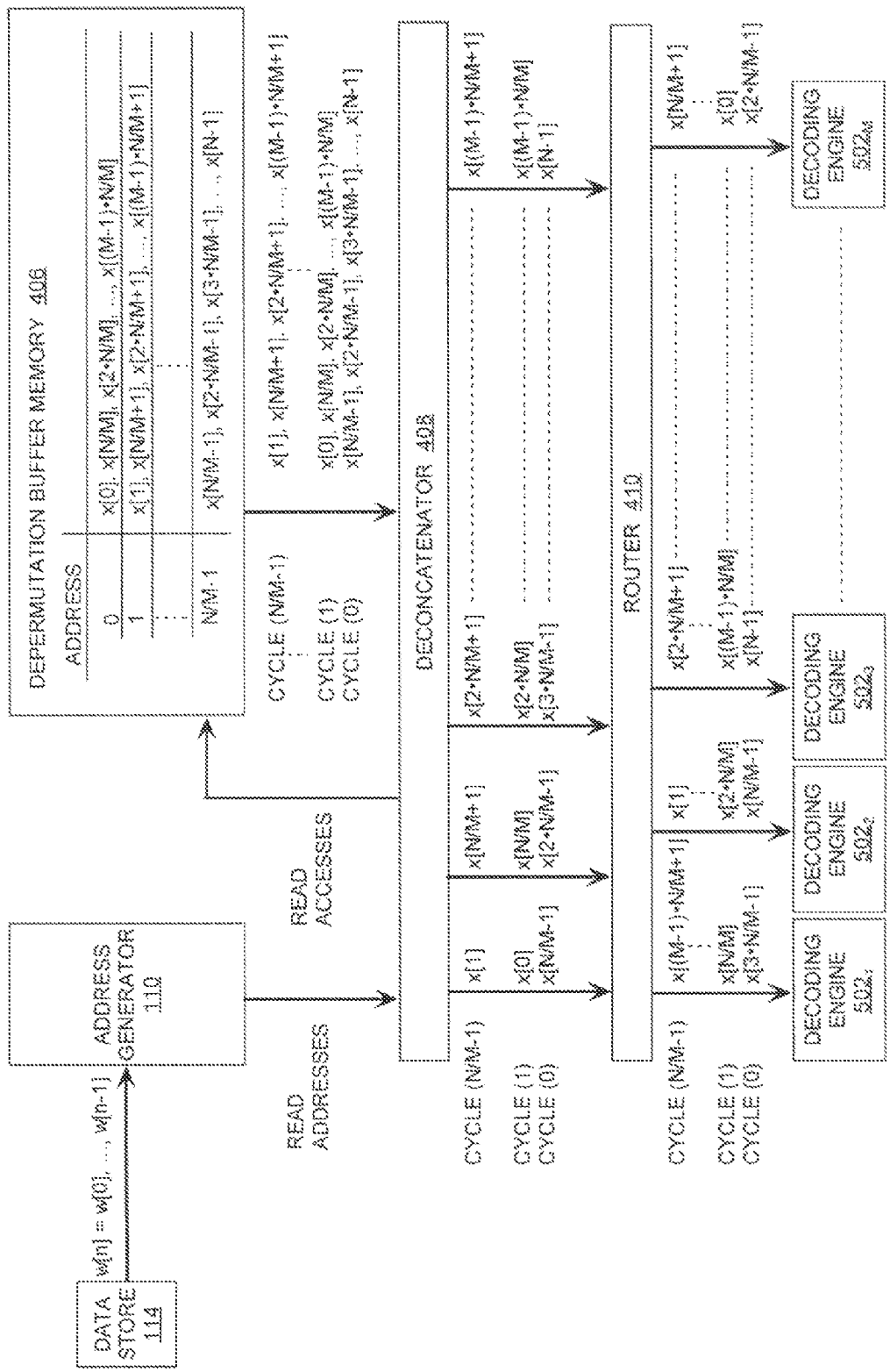

Referring now to FIG. 11B, serially linked soft-decision bits are communicated, sequentially, from the depermutation buffer memory 406 (described above in relation to FIG. 4) to the deconcatenator 408 (described above in relation to FIG. 4). In this regard, it should be understood that deconcatenator 408 retrieves concatenated codeword segments comprising sets of serially linked soft-decision bits from memory location in the depermutation buffer memory 406. Concatenated codeword segments are retrieved using addresses generated by the address generator 110 (described above in relation to FIG. 1 and FIG. 4). For example, the address generator 110 can use the sequence w[0], . . . , w[n−1], which is stored in a permutation table of the data store 114 for this purpose. If should also be appreciated that the deconcatenator 408 receives from the depermutation buffer memory 406 a single set of serially linked soft-decision bits per cycle. For example, the deconcatenator 408 retrieves serially linked soft-decision bits x[N/M−1], x[2−N/M−1], x[3−N/M−1], . . . , x[N−1] from a memory location address N/M−1 during a cycle zero (0). The deconcatenator 408 retrieves serially linked soft-decision bits x[0], x[N/M], x[2−N/M], . . . , x[(M−1)·N/M] from a memory location address zero (0) during a cycle one (1), and so on.

Notably, the sets of serially linked soft-decision bits are retrieved from the depermutation buffer memory 406 in an order different from the order in which the serially linked soft-decision bits were written to the depermutation buffer memory 406 for storage (as shown in FIG. 11A). As described above, the order in which the serially linked soft-decision bits are retrieved from the depermutation buffer memory 406 is determined by the address generator 110 using inverse permutation data (i.e., a sequence w[n]) stored in a permutation table of the data store 114.

After the deconcatenator 408 receives a concatenated codeword segment comprising a set of serially linked soft-decision bits, the deconcatenator 408 performs processing on the serially linked soft-decision bits to break the same into a plurality of soft-decision bits. For example, the deconcatenator 408 breaks the set of serially linked soft-decision bits x[N/M−1], x[2−N/M−1], x[3−N/M−1], . . . , x[N−1] into a plurality of soft-decision bits during a cycle zero (0. The deconcatenator 408 breaks the set of serially linked soft-decision bits x[0], x[N/M], x[2−N/M], . . . , x[(M−1)·N/M] into a plurality of soft-decision bits during a cycle one (1), and so on.

After processing a received set of serially linked soft-decision bits, the deconcatenator 408 communicates, in parallel, the soft-decision bits to the router 410 (described above in relation to FIG. 410). For example, the deconcatenator 408 communicates, in parallel, the soft-decision bits x[N/M−1], x[2−N/M−1], x[3−N/M−1], . . . , x[N−1] to the router 410 during a cycle zero (0). The deconcatenator 408 communicates, in parallel, the soft-decision bits x[0], x[N/M], x[2−N/M], . . . , x[(M−1)·N/M] to the router 410 during a cycle one (1), and so on. In turn, the router 410 communicates, in parallel, each soft-decision bit to a particular outer decoding engine $502_1$-$502_M$. As shown in FIG. 11B, the outer decoding engines $502_1$-$502_M$ (described above in relation to FIG. 5) are M-way parallelized, and therefore concurrently process the soft-decision bits. For example, the outer decoding engines $502_1$-$502_M$ concurrently process a soft-decision bit x[N/M−1], x[2−N/M−1], x[3−N/M−1], . . . , x[N−1] during a cycle zero (0). The outer decoding engines $502_1$-$502_M$ concurrently process a soft-decision bit x[0], x[N/M], x[2−N/M], . . . , x[(M−1)·N/M] during a cycle one (1), and so on.

It should be appreciated that the above described reading scheme can be generally defined as follows.

| Cycle | Depermutation Buffer Memory 406 Indices |
| --- | --- |
| 0 | w[0], w[N/M], w[2 · N/M], . . . , w[(M − 1) · N/M] |
| 1 | w[1], w[N/M + 1], w[2 · N/M + 1], . . . , w[(M − 1) · N/M + 1] |
| . . . | |
| N/M − 1 | w[N/M − 1], w[2 · N/M − 1], w[3 · N/M − 1], . . . , w[N − 1] | where w[n] is an inverse of v[n]. Without any restrictions on the sequence v[n] (described above in relation to FIG. 8 and FIG. 9), the buffer indices w[n], w[N/M+n], w[2−N/M+n], . . . , w[(M−1)·N/M+n] are likely to be found within different concatenated codeword segments which are located at different memory location addresses. Consequently, multiple reads are required to access multiple concatenated codeword segments, thereby causing a bottleneck between the depermutation buffer memory 406 and the deconcatenator 408.

Notably, a bottleneck is similarly caused between the permutation buffer memory 606 and the deconcatenator 608. In this regard, it should be appreciated that a soil-decision bit processing and storage scheme for the permutation module 104 can be generally defined by the following steps: (1) concatenate soft-decision bits x[n], x[N/M+n], x[2−N/M+n], . . . , x[(M−1)·N/M+n]; and (2) save the concatenated soft-decision bits x[n], x[N/M+n], x[2−N/M+n], . . . , x[(M−1)·N/M+n] in a memory location having an address n. A reading scheme for the permutation module 104 can be generally defined as follows.

| Cycle | Permutation Buffer Memory 606 Indices |
| --- | --- |
| 0 | v[0], v[N/M], v[2 · N/M], . . . , v[(M − 1) · N/M] |
| 1 | v[1], v[N/M + 1], v[2 · N/M + 1], . . . , v[(M − 1) · N/M + 1] |
| . . . | |
| N/M − 1 | v[N/M − 1], v[2 · N/M − 1], v[3 · N/M − 1], . . . , v[N − 1] |

Without any restrictions on the sequence v[n] (described above in relation to FIG. 8 and FIG. 9), the buffer indices v[n], v[N/M+n], v[2−N/M+n], . . . , v[(M−1)·N/M+n] are likely to be found within different concatenated codeword segments which are located at different memory location addresses. Consequently, multiple reads are required to access multiple concatenated codeword segments, thereby causing a bottleneck between the permutation buffer memory 606 and the deconcatenator 608.

To solve these bottleneck problems, a restricted mapping v[n] is implemented in both the SCCC encoder 800 and the SCCC decoder 102. The restricted mapping v[n] is defined by a mathematical equation v[k+m*(N/M)] modulo (N/M)=v[k] modulo (N/M) for m=0, . . . , M−1 and k=0, . . . , (N/M−1). M is an integer value equal to a predetermined number of decoding engines ($302_1$-$302_M$, $502_1$-$502_M$) operating in parallel within the SCCC decoder 102. The restricted mapping v[n] ensures that each concatenated codeword segment contains soft-decision bits needed by the decoding engines ($302_1$-$302_M$, $502_1$-$502_M$) at the same time and during the same decoding cycle. In effect, a single write and read access to a buffer memory 408, 606 are required per decoding cycle. Consequently, the above described bottleneck problems are eliminated.

The following proof is provided to assist a reader in understanding why the above described restricted mapping works. First we will demonstrate that the constraint:

$$v[k+m\cdot(N/M)] \bmod(N/M)=v[k] \bmod(N/M)$$

for $m=0, \ldots, M-1$ and $k=0, \ldots, (N/M-1)$ \hfill (P1)

implies that $$w[k+m\cdot(N/M)] \bmod(N/M)=w[k] \bmod(N/M) \text{ for } m=$$
$$0, \ldots, M-1 \text{ and } k=0, \ldots, (N/M-1).$$

From (P1), we know that $$v[k+m*(N/M)]=v[k] \bmod(N/M)+j*(N/M)$$

for some integer $j$, and any $m=0, \ldots, m=1$ \hfill (P2)

The one-to-one mapping between v[n] and the integers 0, N−1 further implies that 0<=j<M, and therefore $$v[k+m*(N/M)]=v[k] \bmod(N/M)+j*(N/M)$$

for some integer $m$, and any $j=0, \ldots, M-1$ \hfill (P3)

From our definition of w[ ], we have $$w[v[k+m*(N/M)]]=k+m*(N/M)$$ \hfill (P4)

Substituting w[v[k]]=k $$w[v[k+m*(N/M)]]=w[v[k]]+m*(N/M)$$ \hfill (P5)

From (P3), we know that $$w[v[k+m*(N/M)]]=w[v[k] \bmod(N/M)+j*(N/M)]$$

for some integer $m$, and any $j=0, \ldots, M-1$ \hfill (P6)

By combining mathematical Equation (P6) and (P5), we have $$w[v[k] \bmod(N/M)+j*(N/M)]=w[v[k]]+m*(N/M) \text{ for any } j=0,\ldots,M-1 \quad (P7)$$

The one-to-one mapping of v[k] to 0, ..., N allows us to substitute k=0, ..., (N/M−1) for v[k] and v[k] mod(N/M). We can also swap the use of j and m, so that (P7) is equivalent to $$w[k+m*(N/M)]=w[k]+j*(N/M) \text{ for } m=0,\ldots,M-1, \\ k=0,\ldots,(N/M-1), \text{ and some integer } j.$$

This implies that $$w[k+m*(N/M)] \bmod(N/M)=w[k] \bmod(N/M) \text{ for } m= \\ 0,\ldots,M-1 \text{ and } k=0,\ldots,(N/M-1)$$

(which is what we wanted to prove). This gives us a constraint on w[ ] which is identical to our constraint on v[ ]. The constraints are equivalent. The constraint on w[ ] is used below to prove that the restrictive mapping works for writing to and reading from the depermutation buffer. The constraint on v[ ] can equivalently be used to prove that the restrictive mapping works for writing to and reading from the permutation buffer.

For the depermutation buffer:
As has been described above, the soft-decision bits written to depermutation buffer memory 406, address k, are: x[k+m*(N/M)] m=0, ..., M−1.
The soft-decision bits required by the M outer decoding engines 502 on read cycle k are x[w[k+m*(N/M)]] m=0, ..., M−1. Since w[k+m*(N/M)] modulo (N/M)=w[k] modulo (N/M), the required soft-decision bits can be written as x[w[k]+$p_{k,m}$*(N/M)] with each $p_{k,m}$ taken from the set {0, ..., M−1}. These are all found at address w[k] of depermutation buffer memory 408. So all M values x[w[k+m*(N/M)]] for a given k are found at the same depermutation buffer address, namely address w[k].

For the permutation buffer:
The soft-decisions written to permutation buffer memory 606, address k, are: y[k+m*(N/M)] m=0, ..., M−1.
The soft-decisions required by the M inner decoding engines 302 on read cycle k are y[v[k+m*(N/M)]] m=0, ..., M−1. Since v[k+m*(N/M)] modulo (N/M)=v[k] modulo (N/M), the required soft-decisions can be written as y[v[k]+$r_{k,m}$*(N/M)] with each $r_{k,m}$ taken from the set {0, ..., M−1}. These are all found at address v[k] of depermutation buffer memory 408. So all M values y[v[k+m*(N/M)]] for a given k are found at the same depermutation buffer address, namely address v[k].

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

We claim:
1. A method for permuting a sequence of information bits in a serially concatenated convolutional code system comprising;
    generating a first sequence of information bits x[n] using an outer encoder, for n=0, 1, 2, ..., N−1:
    permuting said first sequence of information bits in accordance with a mapping v[n] to generate a second sequence of information bits y[n];
    communicating said second sequence of information bits to an inner encoder for generating an encoded sequence of information bits; and
    selecting v[n] to define a restricted mapping wherein v[k+m·(N/M)] modulo (N/M)=v[k] modulo (N/M) for m=0, ..., M−1 and k=0, ..., (N/M−1), where (N/M) is an integer value.

2. The method according to claim 1, further comprising the step of selecting M to have a value equal to a predetermined number of decoding engines operating in parallel and provided to decode said encoded sequence of information bits.

3. The method according to claim 1, further comprising the step of decoding said encoded sequence of information bits in an inner decoding module using M inner decoding engines to generate M outputs.

4. The method according to claim 3, further comprising concatenating said plurality of M outputs from said M inner decoding engines to form a concatenated codeword segment.

5. The method according to claim 4, further comprising storing a plurality of said concatenated codeword segments, each in a predetermined memory location in a reverse permutation buffer memory.

6. The method according to claim 5, further comprising retrieving one of said plurality of concatenated codeword segments from said reverse permutation buffer memory, deconcatenating said concatenated word segment to isolate said M outputs, and respectively routing said M outputs to a plurality of M outer decoding engines.

7. The method according to claim 6, further comprising determining an address from which said concatenated codeword segment is retrieved based on a mapping w[n] which is defined as an inverse of said mapping v[n].

8. A serially concatenated convolutional code decoding system, comprising:
    an outer decoder module configured for generating a first sequence of soft-decision bits x[n] for n=0, 1, 2, ..., N−1;
    a permutation module configured for permuting said first sequence of soft-decision bits x[n] generated by said outer decoder module in accordance with a mapping v[n] to generate a second sequence of soft-decision bits y[n] for communication to an inner decoder module; and
    at least one data store having said mapping v[n] stored therein and wherein v[k+m·(N/M)] modulo (N/M)=v[k] modulo (N/M) for m=0, ..., M−1 and k=0, ..., (N/M−1), where (N/M) is an integer value.

9. The system according to claim 8, wherein M is equal to a predetermined number of decoding engines operating in parallel in each of said inner decoder module and said outer decoder module.

10. The system according to claim 8, wherein said M decoding engines in said outer decoder module generate M outputs.

11. The system according to claim 10, wherein said permutation module further comprises a concatenator configured for concatenating said plurality of M outputs from said M outer decoding engines to form a concatenated codeword segment.

12. The system according to claim 11, further comprising a permutation buffer memory coupled to said concatenator and configured for storing a plurality of said concatenated word segments, each in a predetermined memory location.

13. The system according to claim 12, further comprising a deconcatenator operatively coupled to said permutation buffer memory and configured for individually retrieving said concatenated codeword segments from said permutation buffer memory, and deconcatenating each said concatenated codeword segment to isolate said M outputs contained therein.

14. The system according to claim 13, further comprising a router operatively coupled to said deconcatenator configured for respectively routing said M outputs to a plurality of M inner decoding engines.

15. The system according to claim 14, further comprising an address generator configured for determining an address from which said concatenated codeword segment is retrieved based on a mapping w[n] which is defined as an inverse of said mapping v[n].

* * * * *